(12) United States Patent
Rayaprolu et al.

(10) Patent No.: US 11,404,139 B2
(45) Date of Patent: Aug. 2, 2022

(54) SMART SAMPLING FOR BLOCK FAMILY SCAN

(71) Applicant: MICRON TECHNOLOGY, INC., Boise, ID (US)

(72) Inventors: Vamsi Pavan Rayaprolu, San Jose, CA (US); Shane Nowell, Boise, ID (US); Michael Sheperek, Longmont, CO (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/125,895

(22) Filed: Dec. 17, 2020

(65) Prior Publication Data

US 2022/0199187 A1 Jun. 23, 2022

(51) Int. Cl.
| | |
|---|---|
| *G11C 16/34* | (2006.01) |
| *G11C 29/44* | (2006.01) |
| *G11C 29/42* | (2006.01) |
| *G11C 29/12* | (2006.01) |
| *G11C 29/10* | (2006.01) |

(52) U.S. Cl.
CPC ............ *G11C 29/44* (2013.01); *G11C 16/349* (2013.01); *G11C 29/10* (2013.01); *G11C 29/12015* (2013.01); *G11C 29/42* (2013.01); *G11C 2207/2254* (2013.01)

(58) Field of Classification Search
CPC ..... G11C 29/44; G11C 29/12015; G11C 29/42; G11C 29/10; G11C 2207/2254
See application file for complete search history.

(56) References Cited

U.S. PATENT DOCUMENTS

| | | | | |
|---|---|---|---|---|
| 2016/0147582 | A1* | 5/2016 | Karakulak | ............ G06F 11/073 714/37 |
| 2016/0148701 | A1* | 5/2016 | Karakulak | ........... G11C 11/5642 365/185.18 |
| 2016/0148702 | A1* | 5/2016 | Karakulak | ........... G11C 29/021 365/185.12 |

* cited by examiner

*Primary Examiner* — Jay W. Radke
(74) *Attorney, Agent, or Firm* — Lowenstein Sandler LLP

(57) ABSTRACT

A system can include a memory device and a processing device to perform operations that include performing a block family calibration scan of the memory device, wherein the calibration scan comprises a plurality of scan iterations, wherein each scan iteration is initiated in accordance with at least one threshold scan criterion, and wherein each scan iteration comprises identifying at least one first voltage bin, wherein each first voltage bin is associated with a plurality of read level offsets, identifying, according to a block family creation order, an oldest block family from a plurality of block families associated with the first voltage bin, and updating at least one bin pointer of the oldest block family based on a data state metric of at least one block of the oldest block family.

20 Claims, 19 Drawing Sheets

Voltage Boundary Table 310

| Bin | Boundary |
|---|---|
| 0 | < V1 |
| 1 | < V2 |
| 2 | < V3 |
| 3 | < V4 |
| 4 | < V5 |
| 5 | < V6 |
| 6 | < V7 |
| 7 | >= V7 |

Voltage Offset Table 320

Voltage Offsets

| Level\Bin | Bin 0 | Bin 1 | Bin 2 | Bin 3 | Bin 4 | Bin 5 | Bin 6 | Bin 7 |
|---|---|---|---|---|---|---|---|---|
| L1 | V10 | V11 | V12 | V13 | V14 | V15 | V16 | V17 |
| L2 | V20 | V21 | V22 | V23 | V24 | V25 | V26 | V27 |
| L3 | V30 | V31 | V32 | V33 | V34 | V35 | V36 | V37 |
| L4 | V40 | V41 | V42 | V43 | V44 | V45 | V46 | V47 |
| L5 | V50 | V51 | V52 | V53 | V54 | V55 | V56 | V57 |
| L6 | V60 | V61 | V62 | V63 | V64 | V65 | V66 | V67 |
| L7 | V60 | V61 | V62 | V63 | V64 | V65 | V66 | V67 |

Voltage Bin for TAP=0 hours 322 (Bin 0)

Voltage Bin for TAP=T hours 324 (Bin 5)

FIG. 3

| Family | Die 0 | Die 1 | ... | Die N-1 | Die N |
|---|---|---|---|---|---|
| 0 | 7 | 7 | 7 | 7 | 7 |
| 1 | 7 | 7 | 7 | 7 | 7 |
| 2 | 7 | 7 | 7 | 7 | 7 |
| 3 | 7 | 7 | 7 | 7 | 7 |
| 4 | 7 | 7 | 7 | 7 | 7 |
| 5 | 7 | 6 | 7 | 7 | 6 |
| ... | ... | ... | ... | ... | ... |
| 59 | 1 | 1 | 1 | 1 | 1 |
| 60 | 1 | 0 | 1 | 0 | 1 |
| 61 | 1 | 0 | 1 | 0 | 1 |
| 62 | 0 | 0 | 0 | 0 | 0 |
| 63 | 0 | 0 | 0 | 0 | 0 |
| 64 | 0 | 0 | 0 | 0 | 0 |

BLOCK FAMILY METADATA TABLE 720

Bin 7 737, Bin 6 736, Bin 1 731, Bin 0 730

| Family | Blocks | Time | Temp |
|---|---|---|---|
| 0 | 0-9 | 1 | 31 |
| 1 | 10-19 | 5 | 42 |
| 2 | 20-29 | 6 | ... |
| 3 | 30-39 | 6 | ... |
| 4 | 40-49 | 11 | ... |
| 5 | 50-59 | 14 | ... |
| ... | ... | ... | ... |
| 59 | 400-499 | 120 | ... |
| 60 | 500-599 | 121 | ... |
| 61 | 600-699 | 122 | ... |
| 62 | 700-799 | 128 | ... |
| 63 | 800-899 | 145 | ... |
| 64 | 900-999 | 156 | ... |

BLOCK METADATA TABLE 710

FIG. 7

| OLD BLOCKS METADATA TABLE 850 | | | |
|---|---|---|---|
| Bin | Oldest Block | 2nd Oldest Block | 3rd Oldest Block |
| 0 | 827 | 865 | 871 |
| 1 | 740 | 755 | 762 |
| 2 | 621 | 638 | 662 |
| 3 | 505 | 561 | 579 |
| 4 | 435 | 448 | 450 |
| 5 | 281 | 302 | 329 |
| 6 | 121 | 165 | 178 |
| 7 | 34 | 71 | 92 |

Younger Bins (0-4)
Older Bins (5-7)
Bin Age Threshold 852

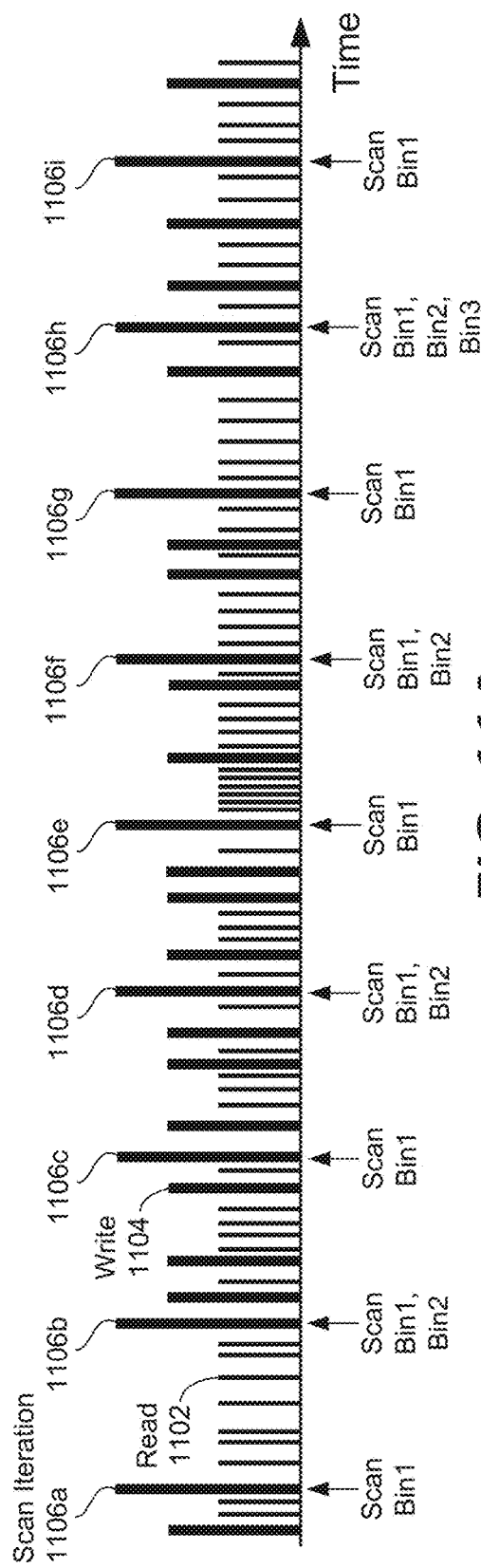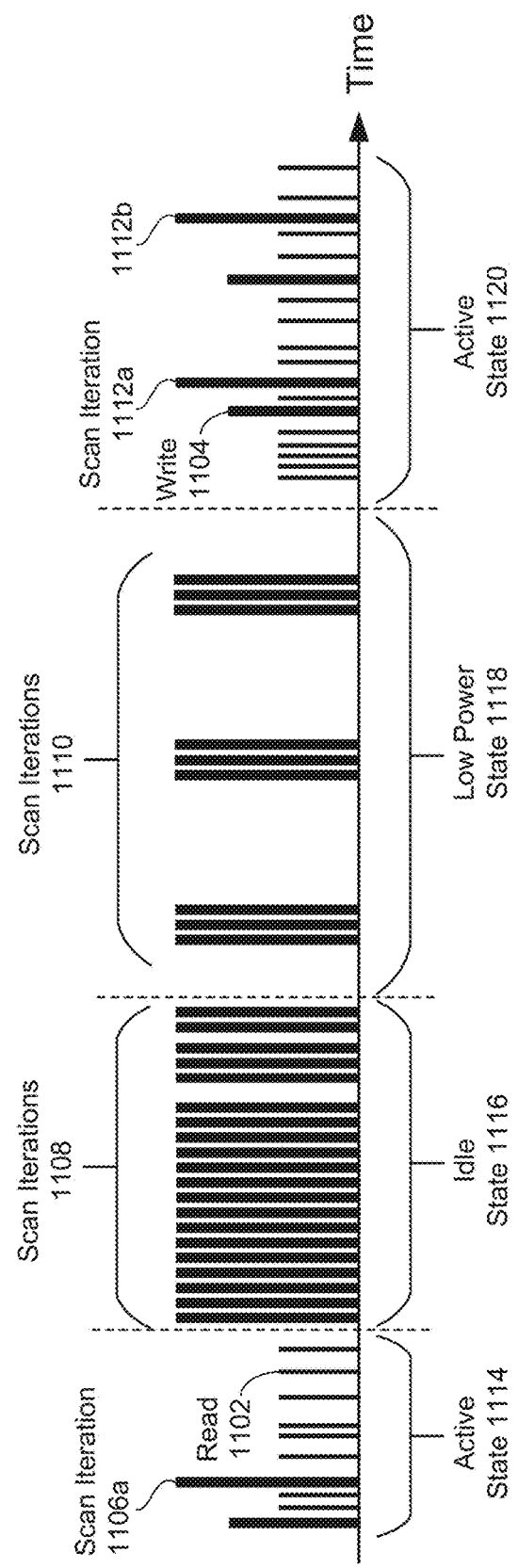

SMART SAMPLING FOR BLOCK FAMILY SCAN

TECHNICAL FIELD

Embodiments of the disclosure relate generally to memory sub-systems, and more specifically, relate to smart sampling for block family scans.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 depicts an example voltage boundary table and an example voltage offset table.

FIG. 7 schematically illustrates example metadata maintained by the memory sub-system controller, in accordance with aspects of the present disclosure.

FIG. 11A schematically illustrates an example calibration scan performed by the memory sub-system controller based on a particular scan frequency, in accordance with aspects of the present disclosure.

FIG. 11B schematically illustrates an example calibration scan, performed by the memory sub-system controller, in which the scan frequency varies based on power state, in accordance with aspects of the present disclosure.

DETAILED DESCRIPTION

Figure 1:
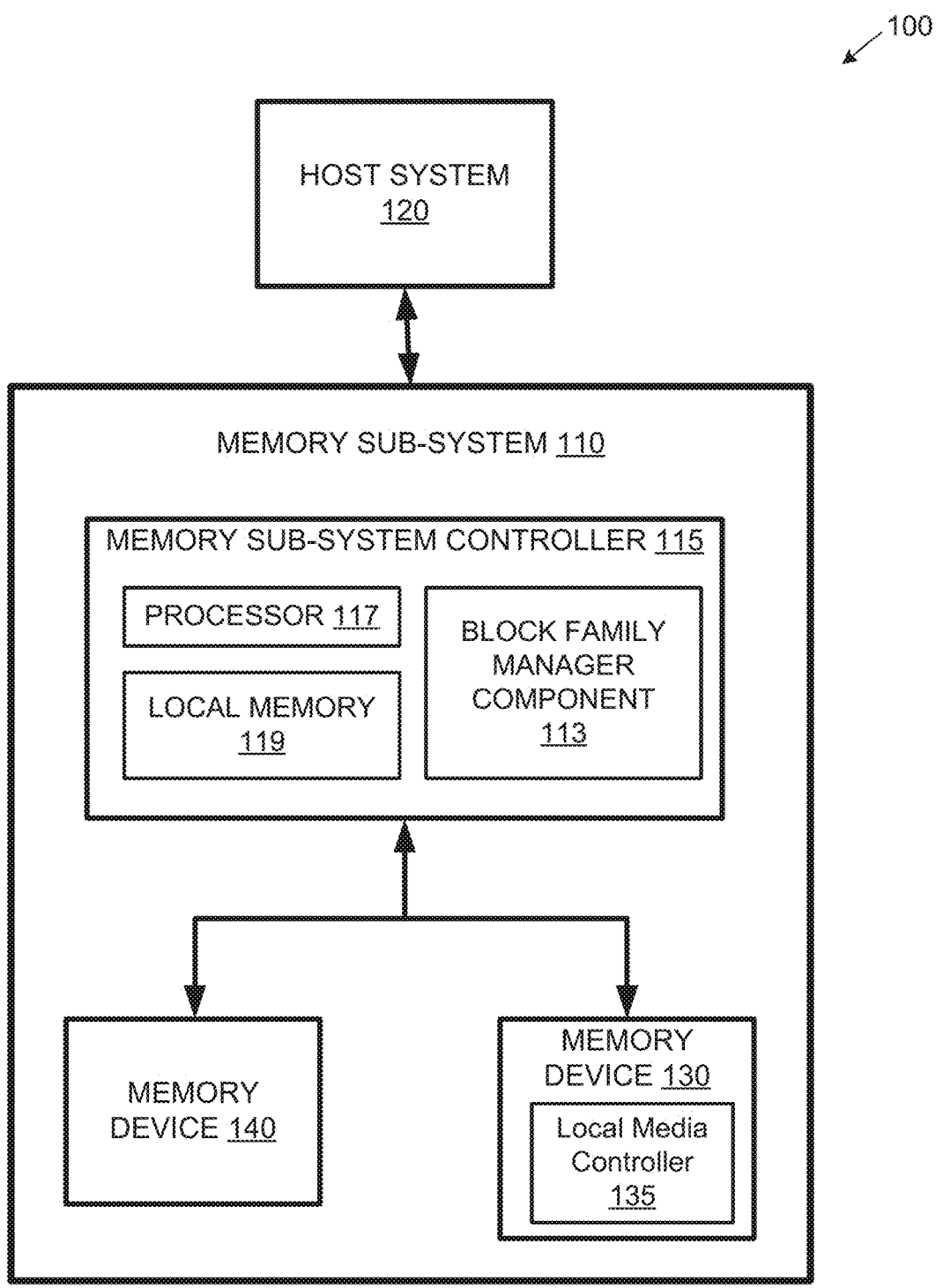
FIG. 1 illustrates an example computing system that includes a memory sub-system in accordance with some embodiments of the present disclosure.

Aspects of the present disclosure are directed to reliability scan assisted bin selection. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dice. Each die can consist of one or more planes. For some types of non-volatile memory devices (e.g., NAND devices), each plane consists of a set of physical blocks.

Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows multiple threshold voltage levels to be used, corresponding to different logical levels. Multiple threshold levels allow a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, a read operation can be performed by comparing the measured voltage exhibited by the memory cell to one or more threshold voltage levels in order to distinguish between two logical levels for single-level cells and between multiple logical levels for multi-level cells.

Because of the phenomenon known as slow charge loss ("SCL"), the threshold voltage of a memory cell changes in time as the electric charge of the cell is degrading, which is referred to as "temporal voltage shift" (since the degrading electric charge causes the voltage distributions to shift along the voltage axis towards lower voltage levels). Temporal voltage shift (TVS) herein shall refer to a change in the measured voltage of cells as a function of time. Temporal Voltage Shift can include different components such as intrinsic charge loss, system charge loss, quick charge loss, etc. Memory formed from certain NAND technologies generally exhibits more TVS than floating gate NAND. TVS is generally increased by Program Erase Cycles (PEC), higher temperatures, and higher program voltages. TVS shows significant die-to-die variation. In memory that exhibits TVS, the threshold voltage is changing rapidly at first (immediately after the memory cell was programmed), and then slows down in an approximately logarithmic linear fashion with respect to the time elapsed since the cell programming event. If not mitigated, the temporal voltage shift caused by the slow charge loss can result in the increased bit error rate in read operations.

Temporal voltage shift can be mitigated by implementing a memory sub-system that employs block family based error avoidance strategies, thus significantly improving the bit error rate exhibited by the memory sub-system. In accordance with embodiments of the present disclosure, the temporal voltage shift is selectively tracked for a programmed set of memory cells grouped by block families. Appropriate voltage "read level offsets," which are based on block affiliation with a certain block family, are applied to the base read levels to perform read operations. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family can be made with any granularity, containing only whole codewords, whole pages, whole super pages, or whole superblocks, or any combination of these. In some implementations, base read levels can be stored in the metadata of the memory device. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state as will be discussed in more detail. A composite data state metric is a function (e.g., a weighted sum) of a set of component state metrics.

"Read level" herein shall refer to a voltage position. Read levels are numbered in increasing voltage from L1 through $2^n$, wherein n is the number of bits that can be stored in the cell. "Read level value" herein shall refer to a voltage or DAC value representing a voltage that that is applied to the read element (often, the control gate for a NAND cell) for purposes of reading that cell. "Read level offset" herein shall refer to a component of the equation that determines the read level value. "Calibration" herein shall refer to altering a read level value (possibly by adjusting a read level offset or read level base) to better match the ideal read levels for a read or set of reads.

"Bin" (or "voltage bin" or "voltage offset bin") herein shall refer to a set of read level offsets that are applied to a set of data. The bin offsets are read level offsets that affect the read level for block families within the bin. An old or older bin is one where the read level offsets are directed at data that was written at a relatively early time. A young or younger bin is one where the read level offsets are directed at data written relatively recently. "Bin selection" herein shall refer to the process by which the memory device selects which bin to use for a given read.

The memory sub-system controller can periodically perform a calibration process (also referred to as a calibration scan) to update the associations between block families and bins. Each block family is associated with a set of dies on which blocks of the block family are stored. The association of a block family and dies with voltage bins can be represented by a set of bin pointers that includes a bin pointer for each die of the block family. For a particular block family, each particular die is associated with a bin pointer that identifies ("points to") a voltage bin, thereby establishing an association between the block family and the voltage bin for the particular die. Bins can be identified by bin numbers (e.g., numbers between 0 and 7 in an 8 voltage bin architecture). Each bin pointer can thus be a bin number. The associations of blocks with block families and block families and dies with voltage bins can be stored in respective metadata tables maintained by the memory sub-system controller (e.g., as bin numbers in the metadata tables).

The calibration scan can evaluate a data state metric (e.g., a voltage shift or bit error rate) for each die of each block family with one of a set of predefined voltage bins, e.g., by, for each die of each block family, measuring a value of data state metric of a block (of the block family) stored on the die. The calibration scan can then update a bin pointer associated with the die and block family to point to a voltage bin that corresponds to the measured value of the data state metric. Each voltage bin is in turn associated with a voltage offset to be applied for read operations. For example, the bin pointer can remain the same if the data state metric is in a range associated with the existing bin pointer, or can be changed to point to an older bin if the data state metric is in a range associated with the older bin. Although a block family can be associated (by bin pointers) with multiple different bins, a block family is herein referred to as being associated with ("in") a particular one of the bins. More particularly, a block family is associated with (or in) the oldest bin with which a die of the block family is associated.

Generally, the temporal voltage shift for younger block families (i.e., block families that are more recently created) is more significant than the temporal voltage shift for older block families (i.e., block families that are less recently created). The memory sub-system controller can periodically perform the calibration scan for each block family based on the age of the block family, which corresponds to the voltage bin associated with the block family. For example, in an 8 voltage bin architecture, newly created block families can be associated with voltage bin 0, while the oldest (i.e., least recently created) block families are associated with voltage bin 7. The memory sub-system controller performs the calibration scan for the block families in voltage bin 0 more frequently than for the block families in voltage bin 7, based on the age of the block families associated with voltage bin 0 (e.g., based on the logarithmic linear nature of SCL).

Since the calibration scan involves obtaining measurements of a current state of data at each scanned block family and performing calculations based on the measured state data, the calibration scan can utilize a significant amount of memory sub-system resources. Accordingly, the calibration scan can increase latency and power consumption of the memory sub-system. Thus, the calibration scan should be performed infrequently to minimize the reduction in system performance. However, the calibration scan is time-sensitive, because miscalibration can occur when bin pointers associated with a block family are not updated in a timely manner to compensate for the temporal voltage shift of data stored in blocks associated with the block family. Such miscalibration can result in read errors that can adversely affect the memory sub-system's performance. Thus, the calibration scan should be performed frequently to avoid miscalibration and read errors. Determining the appropriate calibration scan frequency can be difficult, because frequent calibration scans can avoid miscalibration and read errors, but can also reduce system performance by consuming system resources such as processor time.

Aspects of the present disclosure address the above and other deficiencies by adjusting the calibration scan to adapt to changing characteristics of the memory sub-system. These characteristics of the memory sub-system are referred to herein as calibration demand characteristics, and can include system state characteristics, such as the power state of the memory sub-system or host, as well as characteristics of data being stored, such as workload characteristics. The calibration demand characteristics can include block family age, power state of the memory sub-system or host (e.g., active, idle, hibernating, or sleeping), workload, program/ erase cycle counts of the memory device, or read error rates. The calibration scan can be adjusted to adapt to changing calibration demand characteristics by, for example, changing the calibration scan frequency in accordance with the calibration demand characteristics. The calibration scan adjustments can be performed in response to detecting that threshold calibration demand criteria are satisfied by the calibration demand characteristics. For example, a set of calibration demand ranges, such as ranges of read error rates, can be associated with a set of corresponding calibration scan adjustment parameters that specify how to adjust the calibration scan for each of the ranges. Alternatively, other suitable functions that map calibration demand to calibration scan adjustment parameters can be used, such as linear or quadratic functions. Thus, the calibration scan can be adjusted based on the characteristics associated with the memory sub-system by modifying scan parameters such as the scan frequency or other criteria that control the initiation of calibration scans.

As an example, the calibration scan can be adjusted based on block family age by selecting a subset of the block families, then scanning the subset of block families, but not other block families. The subset of block families to be scanned can include, for example, the oldest block family in each voltage bin. Alternatively or additionally, a subset of the block families can be prioritized so that the block families in the subset are scanned prior to other block families. The subset of block families to be prioritized can be determined based on read error rates associated with the block families, so that block families associated with read error rates greater than a threshold error rate are scanned prior to other block families having error rates below the threshold. Alternatively, a priority can be associated with each block family based on the block family's error rate, and the block families can be scanned in order according to their priorities.

Calibration scans can be performed based on the power state of the memory sub-system or host system. In an idle state, the memory sub-system can devote a substantial amount of processing time to performing scan operations because few if any host reads or writes are expected to occur. Thus, in response to a transition from an active state 1114 to an idle state 1116, the block family manager component 113 can increase the scan frequency. A calibration scan can be performed in response to determining that at least one threshold criterion is satisfied. The threshold criterion can be based on a power state of the memory sub-system or host system. For example, the threshold criterion can be satisfied when the memory sub-system is in an idle power state, or when the memory sub-system transitions to an active power state from a sleep state or low power state. Further, the calibration scan frequency can be adjusted in proportion to a workload intensity, such as the number of write operations performed by the memory sub-system over a period of time, or in proportion to a number of program/erase cycles associated with a memory device.

Advantages of the present disclosure include, but are not limited to, decreasing a number operations, and thus the amount of time, used in block family calibration scans. For example, data state metric measurement operations performed by calibration scans consume a substantial amount of time. Using the adaptive scan frequency techniques disclosed herein, the memory sub-system is able to perform calibration at high frequencies (with low latencies) during times of higher demand for calibration, so that bin pointers can more accurately reflect the faster rate of charge loss for younger bins. Calibration can be performed at low frequencies during times in which low frequencies are sufficient to maintain read level calibration. Thus, the memory sub-system can reduce the amount of processing time used by the calibration scan during time periods in which high-frequency scans are not needed, while retaining the benefits of high-frequency scans during periods of greater demand, which correspond to periods of greater time sensitivity.

Since the calibration scan frequency can be increased during periods of greater calibration demand, and reduced during periods of lower calibration demand, the assignment of voltage bins to block families can be maintained with greater accuracy while using fewer computational resources during the periods of lower calibration demand. For example, a unit of programmed data in a block family that is near transition to another voltage bin can be older than the age threshold for its currently-associated voltage bin, thereby causing reads to use a less-accurate read level offset for that unit of programmed data. The unit of programmed data is eventually re-assigned to an appropriate older bin by the calibration scan. The delay until this re-assignment can be reduced by prioritizing the oldest block family within each bin, and/or increasing the rate at which bins are scanned, e.g., by increasing the scan frequency when the workload is high, using techniques disclosed herein. As another example, if the unit of programmed data is older than the age threshold for its associated voltage bin, attempts to read the unit of data or associated units of data (e.g., other units in the same page or block) can cause an increased read error rate for the unit's block. Re-assignment of the unit to an appropriate bin can be expedited by prioritizing blocks having high error rates in the calibration scan, using techniques disclosed herein.

Further, since the calibration scan can identify particular block families to scan, such as the oldest block family in teach bin, or block families associated with blocks having high error rates, the number of scanned blocks can be reduced. Thus, a significant amount of memory sub-system resources can be made available for other processes, either in combination with or as an alternative to the increased calibration scan frequency benefits described above. This availability of memory system resources for uses other than the calibration scan results in a decrease in overall memory sub-system latency and an increase in overall memory sub-system efficiency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every data payload (e.g., user data) utilizes multiple dies of the memory devices 130, 140 (e.g., NAND type flash memory devices), such that the payload is distributed through a subset of dies, while the remaining one or more dies are used to store the error correction information (e.g., party bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager component 113 that can select voltage bins to be associated with block families at a memory device, e.g., by performing calibration scans. The block family manager component 113 or another component of memory sub-system controller 115 can perform media-management scans, which can perform media management operations on the memory device 130. The block family manager component 113 can also modify the calibration scans, e.g., by modifying parameters of the scans, based on characteristics associated with the memory device. In some embodiments, the memory sub-system controller 115 includes at least a portion of the block family manager component 113. For example, the memory sub-system controller 115 can include a processor 117 (processing device) configured to execute instructions stored in local memory 119 for performing the operations described herein. In some embodiments, the block family manager component 113 is part of the host system 110, an application, or an operating system. Further details regarding block families and block family manager component 113 are described below.

Figure 2:
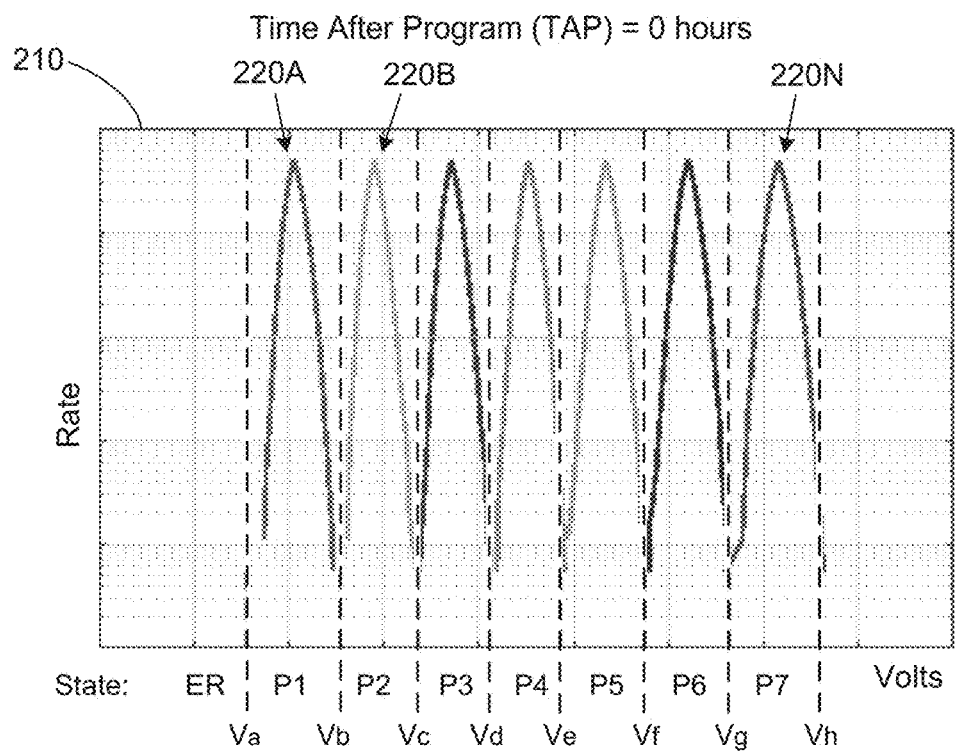
FIG. 2 schematically illustrates the temporal voltage shift caused by the slow charge loss exhibited by triple-level memory cells, in accordance with some embodiments of the present disclosure.
Figure 2:
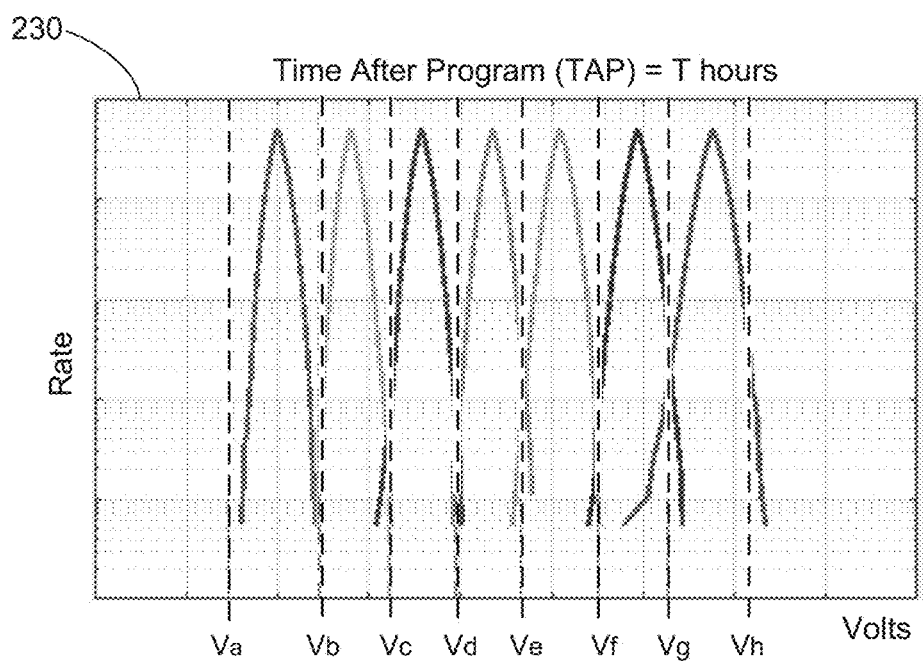

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program voltage distributions 220A-420N (also referred to as "program distributions" or "voltage distributions" or "distributions" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is the primary driver of TVS (temporal voltage shift). TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes).

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

FIG. 3 depicts an example voltage boundary table and an example voltage offset table. The voltage boundary table 310 and the voltage offset table 320 can be used to determine read level offsets, which are added to a base read level voltage to read data from memory cells. As the time after program increases, the threshold voltages for the distribution of the memory cell can change as a result of storage charge loss, as illustrated in the example of FIG. 2. To determine the appropriate read level offset for reading a cell, a measurement of the cell can be performed to estimate the time after program of the cell based on data state metrics such as voltages. For example, the level 7 distribution of the cell can be measured, and the difference between the measured read level (e.g., 100 millivolts) and a reference read level (e.g., 0 volts) can be determined. The difference corresponds to the time after program of the memory cell, and can be used to identify a read level offset to add to the base read threshold level to perform read operations.

The voltage boundary table 310 can be used to identify a bin that contains read offsets for use in reading data from the memory cell. The bin to be used is the value of the Bin column for which the voltage difference (between the measured read level and the reference read level) corresponds to a voltage range shown in the Boundaries column. For example, if the difference is less than V1, then bin 0 is to be used. If the difference is between V1 and V2, then bin 1 is to be used, and so on. The voltage offsets table can be used to identify the read level offsets to be used for the identified bin. For example, if the bin to be used is bin 0, then the corresponding one of the offsets shown in the column labeled "Bin 0" 322 (e.g., V10, V20, ... V60) is to be added to the base read offset level (and any other offsets) for each of levels 1-7 when reading the memory cell. "Bin 0" 322 corresponds to the time after program of 0 hours shown in FIG. 2. A column "Bin 5" 324 corresponds to the time after program of T hours shown in FIG. 2, and has offsets of greater magnitude. Bin numbers less than a threshold age value can be referred to as "younger bins" and bin numbers greater than or equal to the threshold age value can be referred to as "older bins." For example, if the threshold age value is the bin number 5, then bins 0-4 can be referred to as younger bins, and bins 5-7 can be referred to as older bins. As another example, if the threshold age value is the bin number 4, then bins 0-3 can be referred to as younger bins, and bins 4-7 can be referred to as older bins.

As described above, "read level" herein shall refer to a voltage position. Read levels are numbered in increasing voltage from L1 through 2^(number of bits). As an example, for TLC, the read levels would be L1, L2, . . . , L7. "Read level value" herein shall refer to a voltage or DAC value representing a voltage that that is applied to the read element (often, the control gate for a NAND cell) for purposes of reading that cell. "Read level offset" herein shall refer to a component of the equation that determines the read level value. Offsets can be summed (i.e., read level value=offset_a+offset_b+ . . . ). By convention, one of the read level offsets can be called the read level base. "Calibration" herein shall refer to altering a read level value (possibly by adjusting a read level offset or read level base) to better match the ideal read levels for a read or set of reads.

As described above, "bin" (or "voltage bin" or "voltage offset bin") herein shall refer to a set of read level offsets that are applied to a set of data. The bin offsets are read level offsets that affect the read level for block families within the bin. In this context, a bin is usually primarily directed at addressing TVS, but can also be directed at other mechanisms (e.g., temperature coefficient (tempco) miscalibration). An old or older bin is one where the read level offsets are directed at data that was written at a relatively early time. A young or younger bin is one where the read level offsets are directed at data written relatively recently. The read level adjustments can be implemented through either offsets or read retries, or even as an adjustment to the base. Bin selection herein shall refer to the process by which the memory device selects which bin to use for a given read.

Figure 4A:
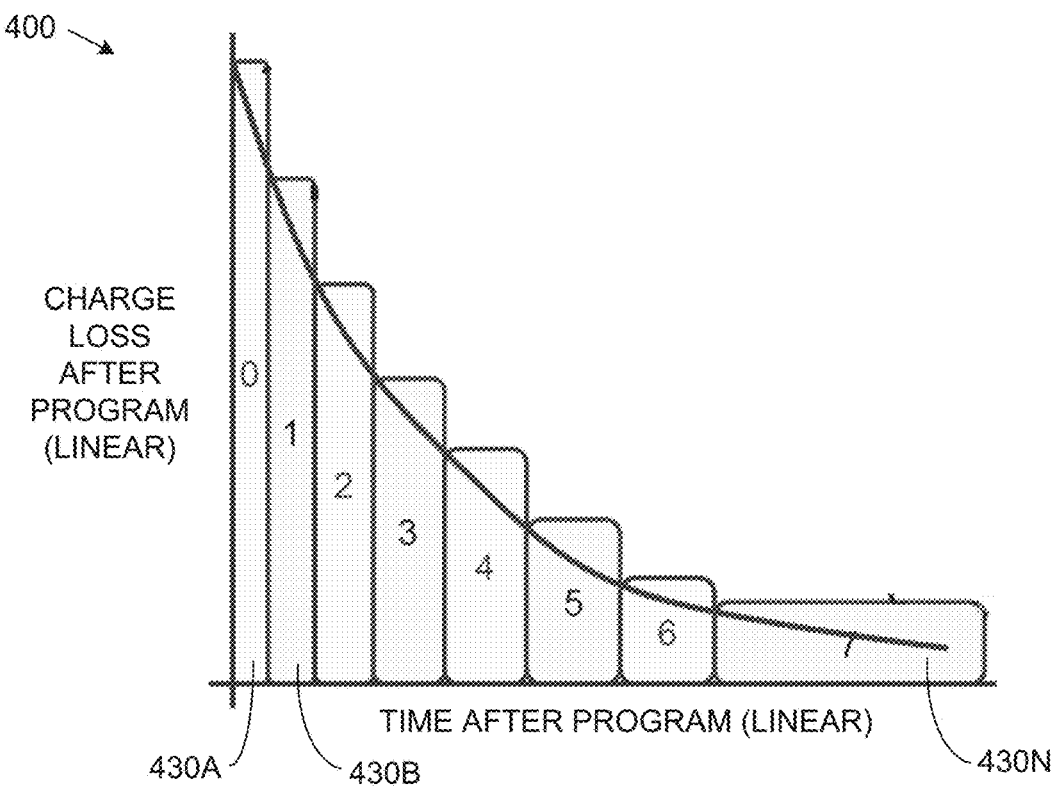
FIG. 4A depicts an example graph illustrating the dependency of the threshold voltage offset on the time after program (i.e., the period of time elapsed since the block has been programmed, in accordance with some embodiments of the present disclosure.

FIG. 4A depicts an example graph 400 illustrating the dependency of the threshold voltage offset on the time after program (i.e., the period of time elapsed since the block has been programmed, in accordance with some embodiments of the present disclosure. As schematically illustrated by FIG. 4A, blocks families of the memory device are grouped into bins 430A-430N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family—are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family. The memory sub-system controller can maintain an identifier of the active block family, which is associated with one or more blocks as they are being programmed.

A newly created block family can be associated with bin 0. Then, the memory sub-system controller can periodically perform a calibration process in order to associate each die of every block family with one of the predefined voltage bins (bins 0-7 in the illustrative example of FIG. 4A), which is in turn associated with the voltage offset to be applied for read operations. The associations of blocks with block families and block families and dice with voltage bins can be stored in respective metadata tables maintained by the memory sub-system controller, such as metadata tables described with respect to FIG. 7 below.

Figure 4B:
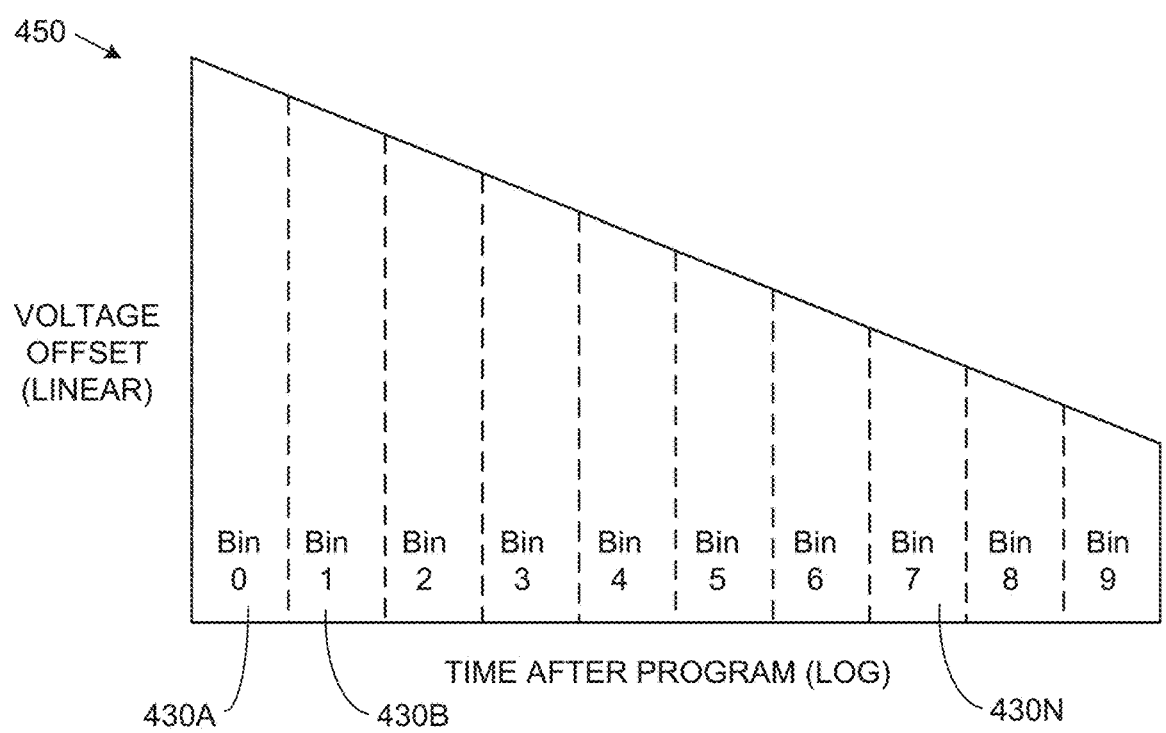
FIG. 4B schematically illustrates a set of predefined voltage bins, in accordance with embodiments of the present disclosure.

FIG. 4B schematically illustrates a set of predefined threshold voltage bins, in accordance with embodiments of the present disclosure. As schematically illustrated by FIG. 4B, the threshold voltage offset graph 450 can be subdivided into multiple voltage bins, such that each voltage bin corresponds to a predetermined range of threshold voltage offsets. While the illustrative example of FIG. 4B defines ten voltage bins, in other implementations, various other numbers of voltage bins can be employed (e.g., 64 bins). The memory sub-system controller can associate each die of every block family with a voltage bin, based on a periodically performed calibration process, described in further detail below.

Figure 5:
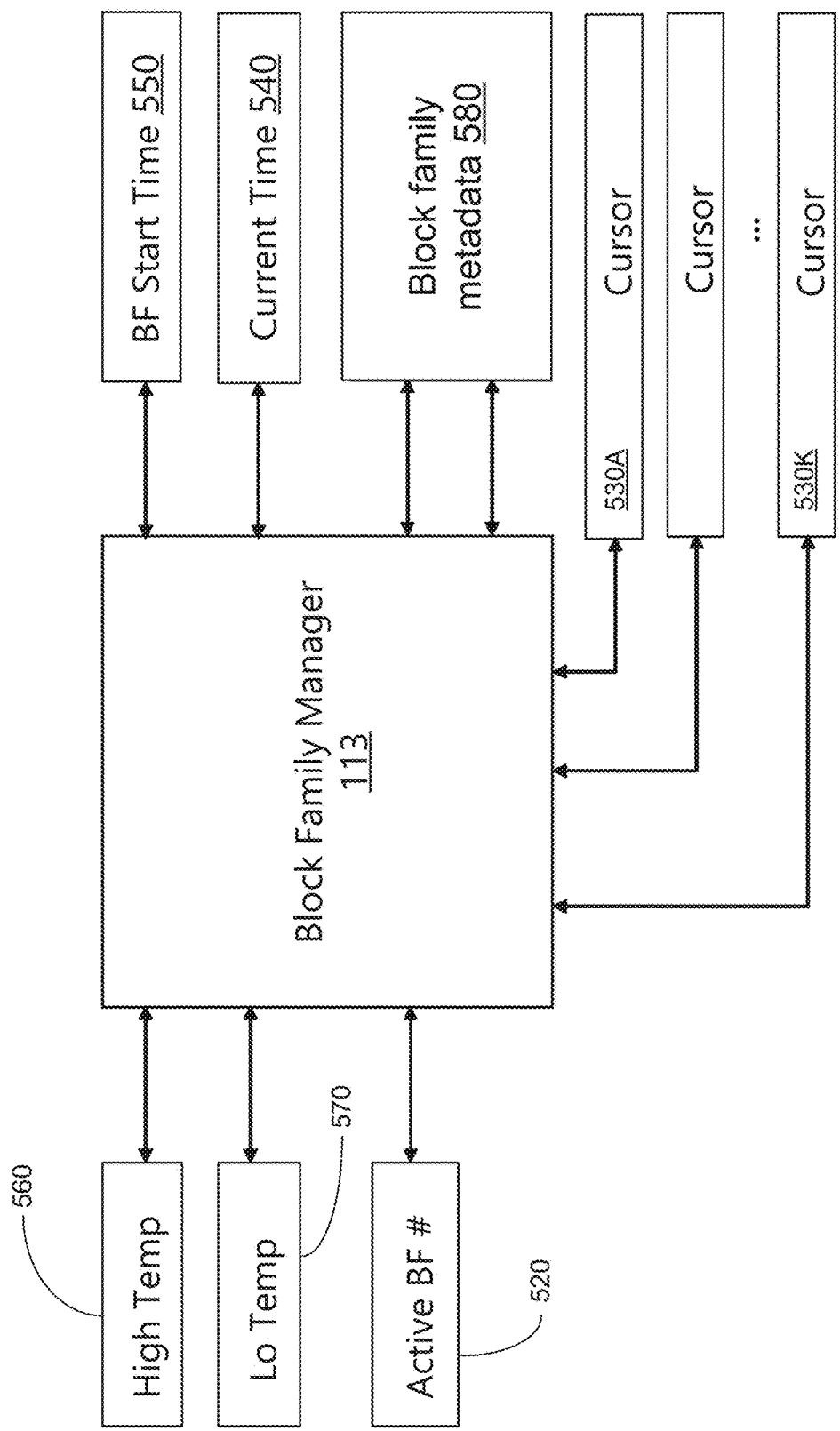
FIG. 5 schematically illustrates block family management operations implemented by a block family manager component, in accordance with embodiments of the present disclosure.

FIG. 5 schematically illustrates block family management operations implemented by the block family manager component 113 of the memory sub-system controller 115, in accordance with embodiments of the present disclosure. As schematically illustrated by FIG. 5, the block family manager component 113 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, block family manager component 113 stores the current time 540 in a memory variable as the block family start time 550. As the blocks are programmed, block family manager component 113 compares the current time 540 to the block family start time 550. Responsive to detecting that the difference of the current time 540 and the block family start time 550 is greater than or equal to the specified time period (e.g., a predetermined number of minutes), block family manager component 113 updates the memory variable storing the active block family identifier 520 to store the next block family number (e.g., the next sequential integer number), and the memory variable storing the block family start time 550 is updated to store the current time 540.

The block family manager 510 also maintains two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, block family manager component 113 associates the block with the currently active block family. The association of each block with a corresponding block family is reflected by the block family metadata 710, as described in more detail herein below with reference to FIG. 7.

As described previously, based on a periodically performed calibration process, the block family manager component 113 associates each die of every block family with a voltage bin, which defines a set of threshold voltage offsets to be applied to the base voltage read level in order to perform read operations. The calibration process involves performing, with respect to a specified number of randomly selected blocks within the block family that is being calibrated, read operations utilizing different threshold voltage offsets, and choosing the threshold voltage offset that minimizes the error rate of the read operation. Block family manager 113 determines the particular voltage bin corresponding to the chosen threshold voltage offset and updates metadata for the block family to correspond to the determined voltage bin.

In some embodiments, the frequency at which the memory sub-system controller performs the calibration process for each voltage bin can be based on an age of the block families associated with the voltage bin. As described previously with respect to FIG. 4A, newly created block families can be associated with voltage bin 0 and older block families on the memory device can be associated with subsequently numbered voltage bins. The temporal voltage shift for block families in a younger voltage bin is more significant than the temporal voltage shift for block families associated with an older voltage bin. This is illustrated in FIG. 4B, as the voltage offset for bin 0 shifts at quicker rate than the voltage offset for older voltage bins (e.g., voltage bins 9, 8, 7, etc.). Therefore, the memory sub-system controller can perform the calibration process for block families associated with voltage bin 0 at a higher frequency than for block families associated with voltage bin 9 to associate each block family with an appropriate voltage bin.

Figure 6:
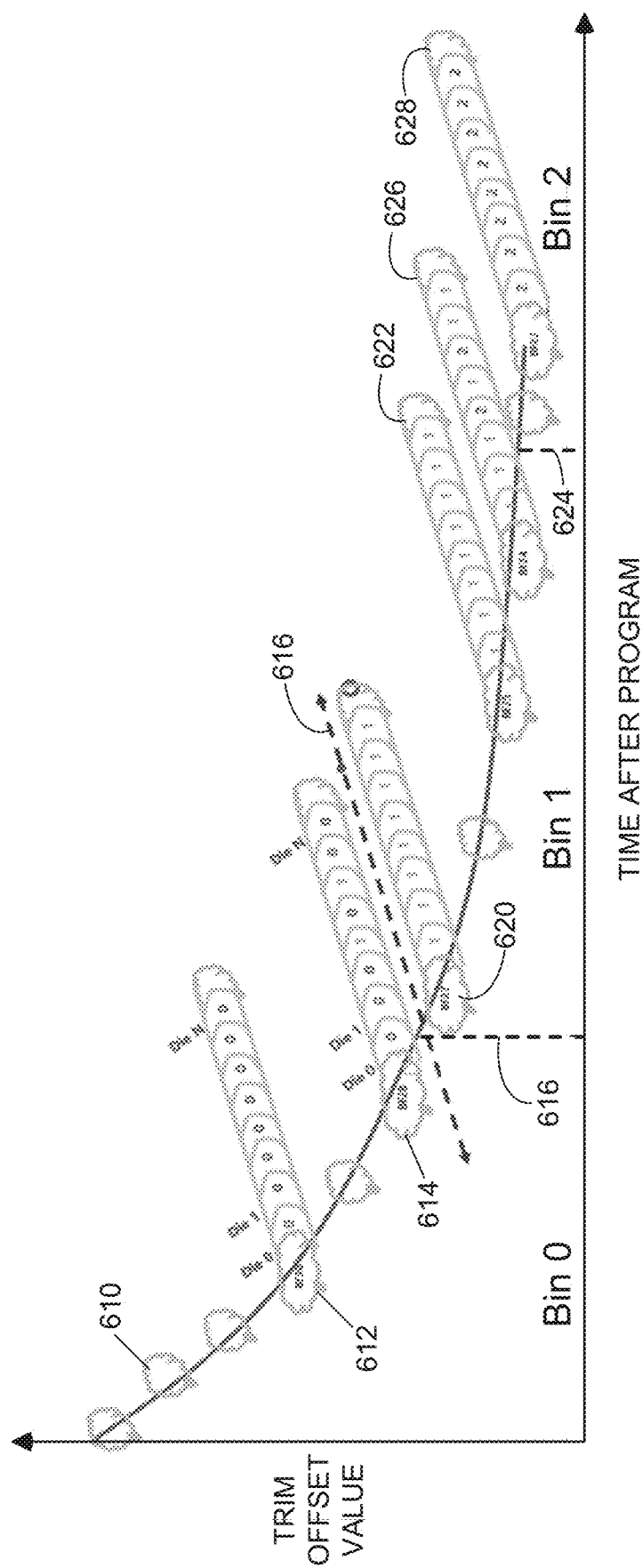
FIG. 6 schematically illustrates selecting block families for calibration, in accordance with embodiments of the present disclosure.

FIG. 6 schematically illustrates selecting block families for calibration, in accordance with embodiments of the present disclosure. Three bins are shown, named bin 0, bin 1, and bin 2. Bin 0 includes block families 610, 612, and 614. Bin 1 includes block families 620, 622, and 626. Bin 2 includes block family 628. Due to slow charge loss, the oldest block families in a voltage bin will migrate to the next voltage bin before any other block families of the current bin. As such, the memory sub-system controller can limit calibration operations to the oldest block families in a bin (e.g., block family 610 in bin 0 and block family 620 in bin 1). In some embodiments, the memory sub-system controller can identify the oldest block family in a voltage bin based on a bin boundary 616 for the bin. A bin boundary 515 can represent a boundary between two adjacent block families that are each associated with a different bin. The memory sub-system controller can identify the bin boundary 616 for a particular voltage bin using a block family metadata table, described in further detail below. The bin boundary 616 is between bins 0 and 1. A second bin boundary 624 is between bins 1 and 2.

FIG. 7 schematically illustrates example metadata maintained by the memory sub-system controller, in accordance with aspects of the present disclosure. In some embodiments, block family manager component 113 can maintain a block metadata table 710 and a block family metadata table 720. In some embodiments, block metadata table 710 and/or block family metadata table 720 can be stored in memory of the memory sub-system (e.g., at memory device 130, 140, local memory 119, etc.) and can be referenced by block family manager component 113 to determine a block family associated with a particular block and/or a voltage bin associated with the block family. As illustrated in FIG. 7, block metadata table 710 and block family metadata table 720 can be separate metadata tables. In other or similar embodiments, block metadata table 710 and block family metadata table 720 can be included in a single metadata table. Additionally or alternatively, block metadata table 710 and block family metadata table 720 can be included in other metadata tables maintained by block family manager component 113, such as a superblock table, an offset table, etc.

In some embodiments, the block metadata table 710 can be indexed by block family and each entry of the block metadata table 710 can include an indication of one or more blocks, spanning one or more die, included in a block family. As illustrated in FIG. 7, block metadata table 710 is indexed by block family and includes an indication of a range of blocks included in each block family. In other or similar embodiments, the block metadata table 710 can be indexed by block and each entry can include an indication of the block family associated with the block. Each entry of block metadata table 710 can also include additional data corresponding to each block. For example, each entry of block metadata table 710 can include an indication of a time (e.g., in hours), when the block was written to the memory device. Additionally or alternatively, each entry can include an indication of a temperature (e.g., in Celsius) when the block was written to the memory device.

Block family table 720 is indexed by the block family number, such that each record of the block family table 720 specifies, for the block family referenced by the index of record, a set of voltage bins associated with respective dice of the block family. In other words, each record of the block family table 720 includes a vector, each element of which specifies the voltage bin associated with the die referenced by the index of the vector element (referred to as a bin pointer). Although individual dice of a block family can be associated with different voltage bins, the block family itself is associated with a particular voltage bin. The block family manager component 113 determines the voltage bin associated with a particular block family based on the bin pointer having the lowest value included in the vector for the block family. In an illustrative example, the lowest bin pointer value of the vector for block family 60 is associated with voltage bin 0 (i.e., for die 1). Therefore, block family manager component 113 associates block family 60 with voltage bin 0. Similarly, block families 61-64 are associated with voltage bin 0 (because the lowest bin pointer value in each of blocks 61-64 is 0), block family 59 is associated with bin 1, block family 5 is associated with bin 6, and block families 0-4 are associated with bin 7. As an example, in response to receiving a request to read data included in block family 60, block family manager component 113 uses the threshold voltage associated with voltage bin 0.

A "Bin 0" label 730 is shown next to block families 60-64 to illustrate that block families 60-64 are associated with ("in") Bin 0, a "Bin 1" label 731 is shown next to block family 59 to illustrate that block family 59 is in bin 1, a "Bin 6" label 736 is shown next to block family 5 to illustrate that block family 5 is in bin 6, and a "Bin 7" label 737 is shown next to block families 0-4 to illustrate that block families 0-4 are in bin 7.

A bin boundary can represent a boundary between two adjacent block families that are each associated with a different voltage bin. Therefore, block family manager component 113 can identify a bin boundary for a voltage bin based on the bin pointers of the vector included in each record of the block family table 720. Block family manager component 113 can identify a voltage bin boundary for a particular voltage bin by identifying the oldest block family (i.e., the block family least recently created) associated with a vector including bin pointers for one or more die that correspond to the particular voltage bin. As illustrated in FIG. 7, the vectors for block families 60-64 include a bin pointer associated with voltage bin 0. Block family manager component 113 can associate block family 60 with a bin boundary 722 for voltage bin 0, as block family 60 is the oldest block family of block family table 720 where the bin pointer for die 1 corresponds to voltage bin 0. Block family manager component 113 can associate block family 5 with bin boundary 724 for voltage bin 6, in accordance with previously described embodiments.

As time passes and time after program increases for a particular die, the threshold voltage levels associated with the die can change, and the die can be re-assigned to an "older" bins that that has a threshold voltage level suitable for the time after program associated with that die. Block family manager component 113 can perform a calibration scan to update the bin pointers of each block families so that the bin pointer of each die points to the bin that correspond to the time after program of that die. Thus, the bin numbers can increase from the newest bin (e.g., 0) to the oldest bin (e.g., bin 7) over time as a result of the calibration scan. The calibration scan can be performed for a particular voltage bin by identifying, using block family table 720, an oldest block family associated with the voltage bin (i.e., the block family associated with the bin boundary). In some embodiments, block family manager component 113 can perform the calibration scan for a predefined number of block families associated with the voltage bin (e.g., 2 block families for each calibration scan). In such embodiments, block family manager component 113 can select, using block family table 720, the two oldest block families (e.g., block family 60 and block family 61) associated with the voltage bin. In response to selecting the predefined number of block families, block family manager component 113 can perform the calibration scan, in accordance with embodiments described herein.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the block table 710 is used to identify the block family identifier corresponding to the physical block number; then, the block family identifier is used as the index to the family table 720 in order to determine the voltage bin associated with the block family and the die; finally, the identified voltage bin is used as the index to an offset table (not illustrated) in order to determine the threshold voltage offset corresponding to the bin. The memory sub-system controller can then additively apply the identified threshold voltage offset to the base voltage read level in order to perform the requested read operation.

Figures 8A, 8B:
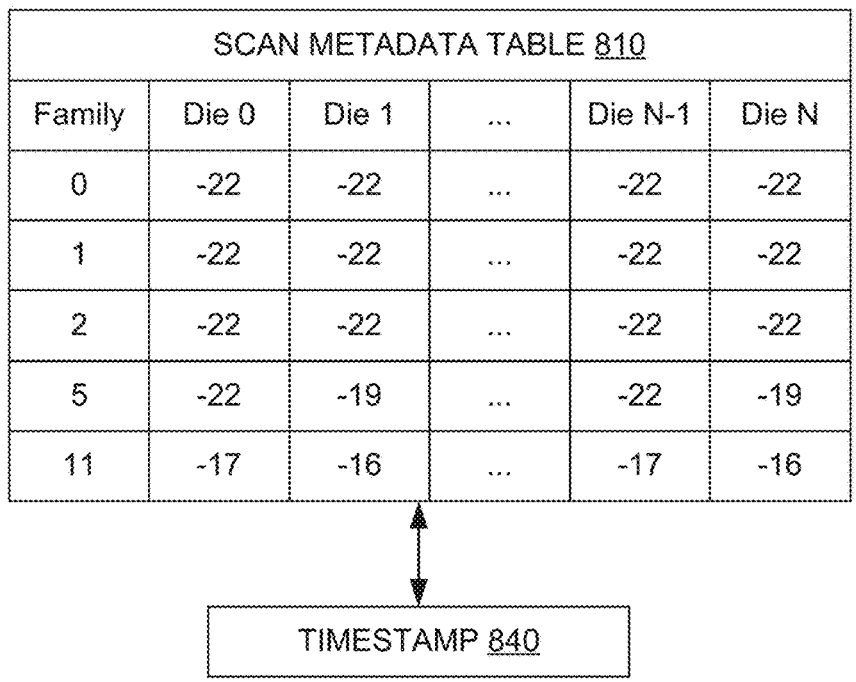
FIG. 8A schematically illustrates example scan metadata generated by a media-management scan and maintained by the memory sub-system controller, in accordance with aspects of the present disclosure.
FIG. 8B schematically illustrates example old blocks metadata generated by a calibration scan and maintained by the memory sub-system controller, in accordance with aspects of the present disclosure.

FIG. 8A schematically illustrates example scan metadata generated by a media-management scan and maintained by the memory sub-system controller, in accordance with aspects of the present disclosure. A scan metadata table 810 can be generated by the media-management scan during or subsequent to each scan. The scan metadata table 810 includes measurement data, which can be values of data state metrics measured (e.g., read) by the media-management scan. The measurement data can be, for example, voltage offsets for each die of each block family. A timestamp 840 indicates a time at which the scan metadata table 810 is generated or provided (e.g., made available) to the calibration scan. The calibration scan can use the timestamp to determine whether the scan metadata table 810 is to be used (e.g., if the timestamp 840 is less than a threshold timestamp) or not to be used (e.g., if the timestamp 840 is greater than a threshold timestamp). The measurement data shown in the scan metadata table 810 include entries for block families 0, 1, 2, 5, and 11. Each entry includes voltage offsets for N dice for a particular block family. For example, the entries for families 0, 1, and 2 each contain the offset value −22 for each die. The entry for family 5 contains the offset values −22, −19, −22, and −19 for dice 0, 1, N−1, and N, respectively, and the entry for family 11 contains the offset values −17, −16, −17, and −16 for dice 0, 1, N−1, and N, respectively.

The calibration scan can use the offset values in the scan metadata table 810 to calibrate bin pointers of the block families listed in the scan metadata table 810. For example, the calibration scan can identify the lowest voltage offset for each block family listed in the scan metadata table 810, and use the lowest voltage offset to determine the bin to be associated with the block family. The bin may be determined using a bin lookup table, such as the voltage boundary table 310, that maps ranges of voltages to bin numbers. For example, the voltage boundary table 310 may include an entry indicating that voltages in the range −27 to −21 volts correspond to bin 7. Since families 0, 1, and 2 are associated with the voltage −22, families 0, 1, and 2 are in bin 7 in this example. The voltage boundary table 310 may also include an entry indicating that voltages between −21 and −18 correspond to bin 6, and voltages between −18 and −15 correspond to bin 5. In this example, family 5 is in bin 6 because the lowest value, −19 volts, is between −21 and −18, and family 11 is in bin 5 because the lowest value, −16 volts, is between −18 and −15. The scan metadata table 810 includes entries for block families in older bins (e.g., bins 5, 6, and 7) because the media-management scan generates data measurements for older bins.

FIG. 8B schematically illustrates example old blocks metadata 850 generated by a calibration scan and maintained by the memory sub-system controller, in accordance with aspects of the present disclosure. The calibration scan can identify one or more of the oldest blocks of one or more bins and store the block identifiers of the identified oldest blocks in the old blocks metadata table 850. The media-management scan can prioritize the old blocks listed in the metadata table 850, e.g., by scanning the old blocks prior to scanning other blocks not listed in the old blocks metadata table 850. Prioritizing the old blocks can reduce miscalibration and bit read errors, because the old blocks are likely close to transitioning to another (older) bin, and scanning the old blocks sooner can reduce the amount of time the old blocks remain in a bin for which they have become too old (because the scan has not processed them yet).

The old blocks metadata table 850 includes an entry for each of the voltage bins 0-7. Each entry contains the block numbers of the oldest block, second oldest block, and third oldest block in the corresponding bin. The oldest block is older than the second oldest block, and the second oldest block is older than the third oldest block. For example, for bin 5, the oldest block is block 281, the second oldest block is block 302, and the third oldest block is block 329. The media management scan can prioritize these old blocks by scanning block 281 (e.g., as soon as possible) then scanning block 302, and then scanning block 329. To implement the prioritization, the media management scan can add the oldest block (281) to the head of a queue of blocks to be scanned, and add the second and third oldest blocks (302 and 329) to the second and third positions in the queue behind the head. The media management scan can scan the oldest blocks of bins 6 and 7 similarly. Alternatively, the old blocks metadata table 850 can include just the oldest block for each bin, or the oldest N blocks for each bin, for any suitable number N.

The bins in the old blocks metadata table 850 that are older than a bin age threshold 852 are labeled "older bins." The bin age threshold is between bins 4 and 5 in the table 850, so bins 5, 6, and 7 are the older bins. The media-management scan scans the older bins. Thus, the younger bins (bins 0-4) can be omitted from the old blocks metadata table 850. However, the calibration scan can use the younger bins, so the younger bins are also shown in the old blocks metadata table 850. The bin age threshold 852 can be determined, for example, empirically, by performing experiments on sample workloads of read and write commands, and determining which value of the bin age threshold 852 provides the best performance for the workloads.

Figure 9:
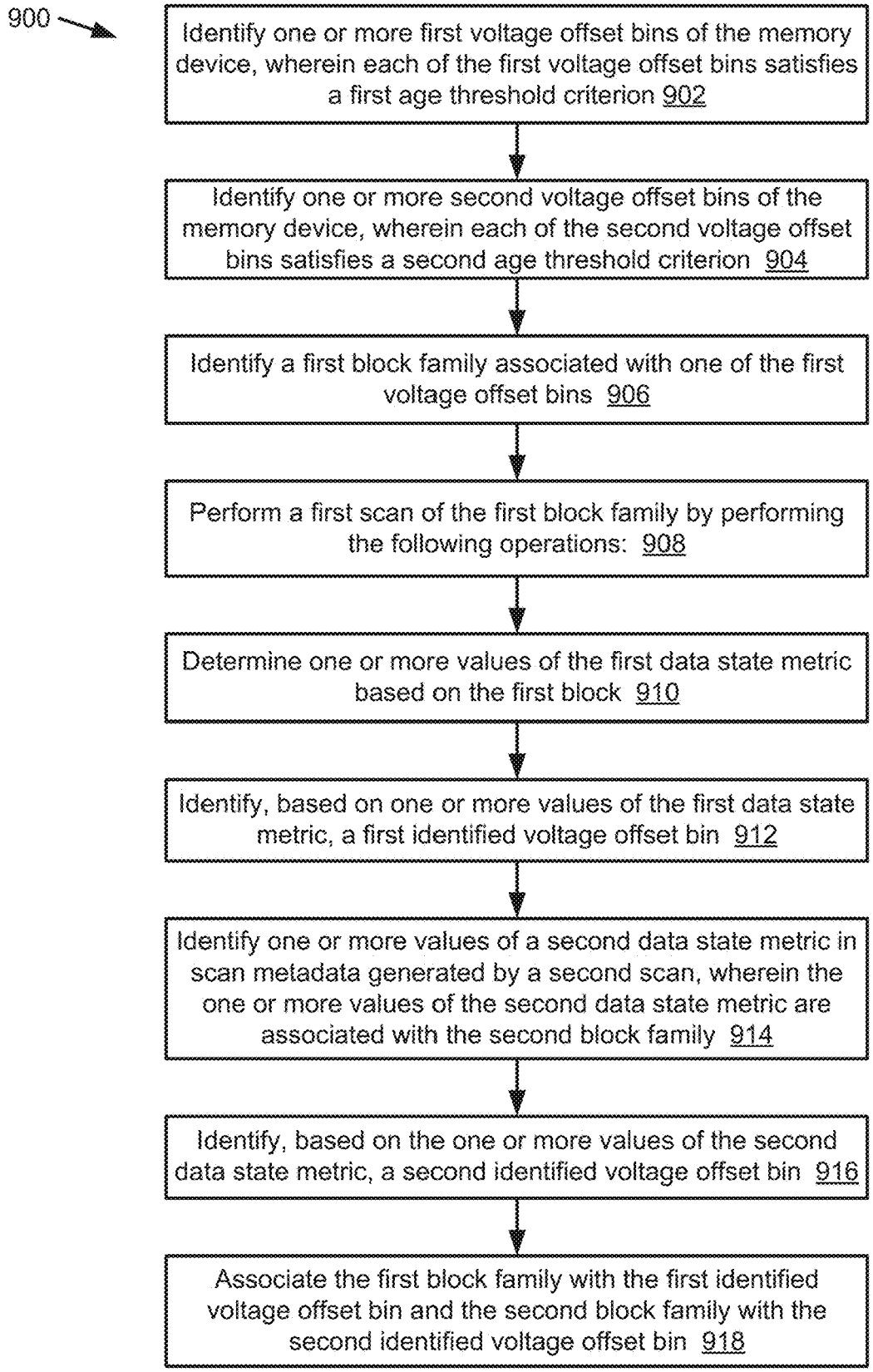
FIG. 9 is a flow diagram of an example method to perform a calibration scan, in accordance with aspects of the present disclosure.

FIG. 9 is a flow diagram of an example method to perform a calibration scan, in accordance with aspects of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

FIG. 9 illustrates an example calibration scan that can use data state metric measurements ("measurement data") provided to the calibration scan by, for example, a media-management scan or other process. The measurement data provided to the calibration scan can be for older bins, and the calibration scan can perform calibration of block family-to-bin associations for the older bins based on the measurement data without performing the time-consuming measurement operations that gather the measurement data. For younger bins, the calibration scan can perform measurement operations and use the resulting measurement data to perform calibration of block family-to-bin associations for the younger bins.

The voltage bins can be categorized as younger bins or older bins according to an age threshold criterion. For example, the age threshold criterion can specify that bins having numbers less than 5 are younger bins, and bins having numbers greater than or equal to 5 are older bins. In other words, in an 8-bin memory sub-system, bins 0-4 can be categorized as younger bins, and bins 5-7 can be categorized as older bins. The bin age threshold 852 that distinguishes younger bins from older bins (e.g., bin 4 from bin 5 in this example) can be determined empirically, as described above, or by other suitable techniques.

The media-management scan can perform measurement operations for each block (at a different rate than the calibration scan) as part of its operation. The media-management scan can be, for example, a reliability scan that performs data integrity checking by measuring data state metrics for each block to assess the integrity of the block. The media-management scan can perform measurement operations for all blocks in the memory sub-system, for example. The measurements of data state metrics are referred to herein as "data measurements." By providing the data measurements for older bins to the calibration scan, embodiments disclosed herein can reduce or eliminate redundant data state measurements that would previously have been performed by the calibration scan for the older bins. The calibration scan can then focus on younger bins by performing data state metric measurements for younger bins more frequently, and using those data state metrics to perform calibration operations for block families associated with the younger bins. Older bins are suitable for scanning by the media-management scan because their associations with block families change less frequently than the associations of younger bins, and the media-management scan is likely to scan blocks at a frequency lower than the frequencies used by the calibration scan for younger blocks, but similar to or greater than the frequencies used by the calibration scan for older blocks.

At operation 902, the processing device identifies one or more first voltage offset bins of the memory device, wherein each of the first voltage offset bins satisfies a first age threshold criterion. At operation 904, the processing device identifies one or more second voltage offset bins of the memory device, wherein each of the second voltage offset bins satisfies a second age threshold criterion. At operation 906, the processing device identifies a first block family associated with one of the first voltage offset bins. The first and second age threshold criteria, like other thresholds described herein, can be determined empirically, e.g., by performing experiments on sample workloads of read and write commands, and determining which value of each threshold provides the best performance for the workloads.

At operation 908, the processing device begins to perform a first scan of the first block family by performing the following operations. The first scan can be, for example, a block family calibration scan. At operation 910, the processing device determines one or more values of the first data state metric based on the first block. As an example, the values of the first data state metric can characterize a voltage shift associated with the first block. The values of the first data state metric can be determined based on measurement of one or more voltages of the first block. The first block can be the oldest block in the first block family, and the measurement can be performed at a specified voltage distribution, such as the 7th distribution (e.g., in the valley of the specified voltage distribution).

At operation 912, the processing device identifies, based on one or more values of the first data state metric, a first identified voltage offset bin. The memory sub-system 110 can store and access a voltage boundary table 310 that comprises a set of voltage boundaries that correspond to voltage ranges and associates each of the voltage boundaries or ranges with a corresponding voltage offset bin. The first voltage offset bin can then be identified by determining that the voltage shift associated with the first block is within a particular one of the plurality of voltage ranges. The voltage boundary table 310 can map the particular one of the plurality of voltage ranges to the identified first voltage offset bin, for example.

As described above, the calibration scan can use the measurement data obtained by the media-management scan to perform calibration operations, such as updating bin pointers, for block families associated with the older bins. The calibration scan can access and use the measurement data from the media-management scan as the measurement data becomes available to the calibration scan (e.g., in response to the media-management scan sending, or otherwise making available, the measurement data to the calibration scan). The calibration scan can use the measurement data as it becomes available if, for example, the calibration scan is otherwise idle (e.g., not performing calibration operations) at the time the measurement data is provided to the calibration scan. Alternatively or additionally, the media-management scan can store the measurement data in a scan metadata table 810, e.g., in association with the block families and dice to which the measurement data corresponds, and the calibration scan can retrieve the measurement data from the scan metadata table 810 as needed (e.g., when the calibration scan processes the block families to which the measurement data corresponds).

The measurement data can include data state metrics for blocks in block families that are associated with older voltage bins. The calibration scan can use the data state metrics to update the assignments of bins to block families. For example, for each block family that is categorized as being in an older bin, the media-management scan can measure and store a value of a data state metric, such as a voltage, for each die of a memory device. The media-management scan can store the measured values in a block family metadata table 720 or other suitable data structure. The calibration scan can access the stored values of the data state metric when it scans each block family, and use the stored values to update the assignments of bins to the block family. For example, when scanning a block family, the calibration scan can, for each die, determine which bin the block family should be assigned to for that die based on the stored value of the data state metric for that block family and die, and update the assignments accordingly. Updating the assignments can result in one or more of the bin pointers associated with the block family being incremented by one (or more), thereby assigning the block family to an older bin (for the one or more dice). As an example, the calibration scan can increment the bin pointer of block family 5 for die 1 from 6 to 7 if the measurement data for block family 5, die 1 is within a range that corresponds to bin 7 according to a voltage boundary table 310, as described above with reference to FIG. 8A.

At operation 914, the processing device identifies one or more values of a second data state metric in scan metadata generated by a second scan, wherein the one or more values of the second data state metric are associated with the second block family. The second scan can be, for example, and media management scan. The scan metadata can be, for example, the scan metadata table 810. In circumstances where the calibration scan selects a block family associated with an older bin, but the second scan has not yet provided measurement data for that block family (e.g., values of the second data state metric in the scan metadata), then the calibration scan can perform the measurement operations to obtain the measurement data for that block family. Such circumstances are expected to be rare, because older bins are scanned at a substantially slower rate than younger bins, as described above.

At operation 916, the processing device identifies, based on the one or more values of the second data state metric, a second identified voltage offset bin. The second identified voltage offset bin can be identified using the voltage boundary table 310, similarly to how the first identified voltage offset bin is identified (as described above with respect to operation 912), for example. At operation 918, the processing device associates the first block family with the first identified voltage offset bin and the second block family with the second identified voltage offset bin. The processing device can associate the first block family with the identified voltage offset bin by identifying, at a block family metadata table 720, a particular entry corresponding to the first block family, and updating the particular entry to include a reference to the identified voltage offset bin.

Figure 10:
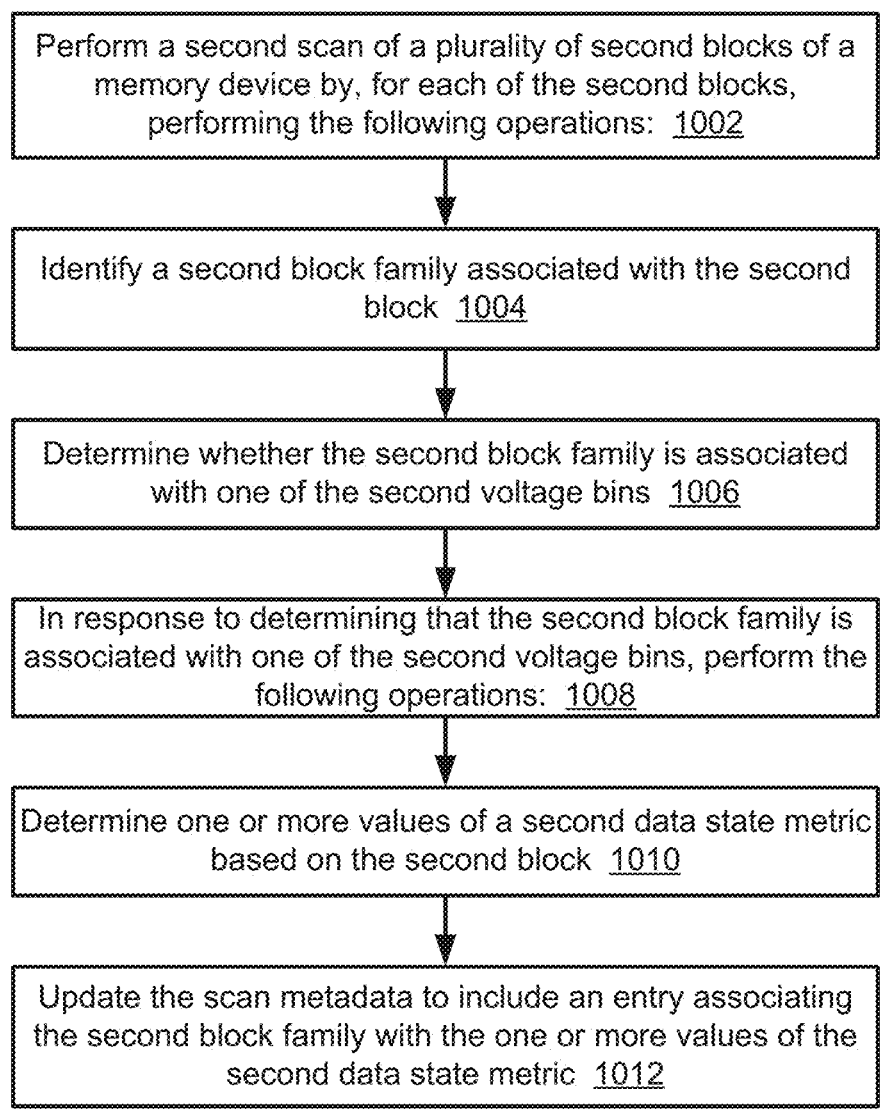
FIG. 10 is a flow diagram of an example method to perform a media-management scan, in accordance with aspects of the present disclosure.

FIG. 10 is a flow diagram of an example method to perform a media-management scan, in accordance with aspects of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1002, the processing device performs a second scan of a plurality of second blocks of a memory device by, for each of the second blocks, performing the following operations. The first and second scans can performed concurrently, e.g., as processes that are executed concurrently by the memory system controller 115. The first scan can process the first voltage offset bins more frequently than the second voltage offset bins, and the second scan can process the first voltage offset bins at the same frequency as the second voltage offset bins. The first scan can be, for example, a calibration scan. The second scan can be a media management scan, and the media management scan can, for each of the second blocks, perform a media management operation based on the one or more values of the second data state metric associated with the second block. The media management operation can include data integrity checking, garbage collection, folding, or wear leveling, for example. For example, a media-management scan that performs data integrity checking is referred to herein as a "reliability scan."

The media-management scan can prioritize blocks from block families that are near a transition to a different bin, so that measurement data for the blocks can be obtained and made available to the calibration scan sooner than measurement data for other blocks. Priority is given to block families near a bin transition by updating the bin pointers associated with these block families (which can be performed by the calibration scan) as soon as possible after the temporal voltage shift of memory cells moves from a range associated with the currently-assigned bin to a range associated with an older bin. Updating the bin pointer to point to the older bin as soon as possible can avoid miscalibration of the read levels of the current bin with the temporal voltage cell of the cells in which the block is stored. Miscalibration can lead to higher bit error counts, for example. The media-management scan can prioritize blocks by, for example, scanning them prior to scanning other blocks. The calibration scan can identify the blocks to be prioritized and include them in a list or table of prioritized blocks. The list or table of prioritized blocks can be provided to the media-management scan, which can scan the blocks in the list of prioritized blocks prior to scanning blocks not in the list. The prioritized blocks can be blocks that are associated with block families that are in older bins, since the media-management scan need not provide data measurements for younger bins to the calibration scan. The prioritized blocks can be the oldest blocks in each of the older bins (e.g., up to a threshold number of the oldest blocks in each of the older bins). The calibration scan can obtain a list of the oldest blocks from the block family manager component 113, which can keep track of the block families sequentially by age within each bin (e.g., as shown in FIG. 7). The media scan can also obtain information about the oldest blocks per bin from the block family manager component 113 to identify the oldest blocks per bin. The memory sub-system can keep track of the power-on minute or hour at which the block was created or written to (and sorted into an ordering by age). The list or table of prioritized blocks can be an old blocks metadata table 850 as shown in FIG. 8B, for example.

To identify prioritized blocks that are near bin transitions, the processing device can access the old blocks metadata table 850. The old blocks metadata table 850 includes one or more entries. Each entry corresponds to a bin and specifies an oldest block of the bin. For each oldest block specified by each entry in the old blocks metadata table 850, the processing device can perform the second scan for the oldest block prior to performing the second scan for other (second) blocks that are not specified as an oldest block in the old blocks metadata table 850.

The media-management scan can use different bin selection criteria than the calibration scan. Since the media-management scan can process blocks at a slower rate than the calibration scan, the media-management scan can obtain more measurement data for each block than the calibration scan. For example, the calibration scan ordinarily obtains measurement data by measuring a data state metric (e.g., a read level voltage) that is a position metric of a single specified voltage distribution (e.g., a level 7 distribution), since the additional time involved in measuring more than one of the voltage distributions would reduce the scan frequency. However, the media-management scan has time available to perform additional measurements. Thus the media-management scan can measure two or more of the voltage distributions, such as a level 1 distribution and the level 7 distribution, to obtain two read level voltages. Measuring more voltage distributions ordinarily increases the accuracy of the measurement. For example, reading a level 7 distribution provides a single read level voltage, which can be used to determine a change in read level voltage at a particular time since program. However, reading the level 1 and 7 distributions provides two values, which can be used to determine changes in read level voltages of levels 1 and 7, respectively.

The value of the change in read level voltage can be used, e.g., with a temporal voltage shift (TVS) function that describes how the data state metric varies as a function of time after program, to determine a time after program of the block being scanned. The time after program can subsequently be used to determine which bin to associate with the block. Interpolation of levels 1 through 6 based on a value of the level 7 distribution can be imprecise, however. Further, a single measured value is susceptible to noise that can distort the measured value. The media-management scan can measure multiple values because it operates at a slower rate than the calibration scan. Further, the media-management scan can use multiple measured values (e.g., of all 8 distributions) to determine the reliability of the block, and can provide these values for use by the calibration scan. Thus, for example, the media-management scan can provide measured values of the level 1 and level 7 distributions to the calibration scan. The calibration scan can use the level 1 value to interpolate levels 1-3, and can use the level 7 value to interpolate levels 4-6. Thus, the availability of the additional measured value can increase the accuracy of the measurements of the levels 1-3 distributions provided to the calibration scan.

At operation 1004, the processing device identifies a second block family associated with the second block, e.g., using the block metadata table 710. At operation 1006, the processing device determines whether the second block family is associated with one of the second voltage bins, e.g., using the block family metadata table 720.

At operation 1008, if the second block family is associated with one of the second voltage bins, the processing device performs operation 1010. If the second block family is not associated with one of the second voltage bins, the method 1000 ends. At operation 1010, the processing device determines one or more values of a second data state metric based on the second block. The values of the second data state metric can characterize a voltage shift associated with the second block. The second data state metric can include a first position metric of a first specified voltage distribution and a second position metric of a second specified voltage distribution. The values of the second data state metric can be determined by measuring the first and second specified voltage distributions within one or more memory cells of the second block for example. The values of the second data state metric can be determined based on the second block by determining that the block family metadata table 720 does not include an indication that the second block has been processed. Further, the block family metadata table 720 can be updated to include an indication that the second block has been processed.

At operation 1012, the processing device updates the scan metadata table 810 to include an entry associating the second block family with the one or more values of the second data state metric. The processing device can provide the scan metadata table 810 to the first scan, and can also provide a timestamp 840 to the first scan, the timestamp indicating a time at which the scan metadata table 810 is provided or generated.

Figure 11C:
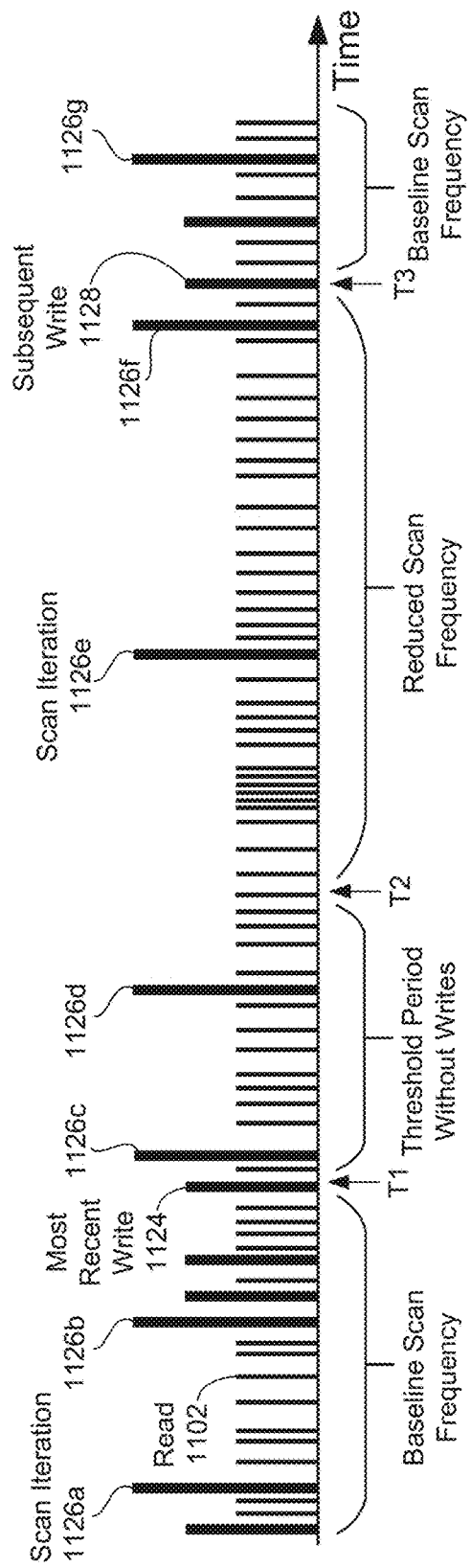
FIG. 11C schematically illustrates an example calibration scan, performed by the memory sub-system controller, in which the scan frequency varies based on workload, in accordance with aspects of the present disclosure.

FIG. 11A schematically illustrates an example calibration scan performed by the memory sub-system controller based on a particular scan frequency, in accordance with aspects of the present disclosure. The calibration scan is illustrated as a sequence of operations that occur over time. Each operation is shown as vertical line, and time increases as shown by the arrow pointing to the right. The illustrated operations include read operations 1102 (each shown as one of the shortest vertical lines), write operations 1104 (each shown as one of the medium-length vertical lines), and scan iterations 1106 (each shown as one of the tallest vertical lines). Each read operation 1102 or each write operation 1104 can be performed by the memory sub-system in response to a respective read or write request from the host. A calibration scan iteration 1106 can include execution of a calibration process that calibrates at least a portion of the block families in the memory sub-system. The calibration scan process can be executed repeatedly at different times (e.g., periodically, or in response to particular criteria being satisfied). For example, in each calibration scan iteration, one or more bins can be calibrated. The lines in FIGS. 11A-11D are not necessarily shown to scale. Each line can be understood as representing the execution of the represented operation, or at least an initiation of execution of the represented operation. The represented operation can finish during the time between the left and right sides of the line, but does not necessarily finish within that time, for example.

Each of the scan iterations 1106a-i can represent an invocation of a calibration scan process that calibrates block families with corresponding bins by updating bin pointers of the block families. The scan iterations 1106a-i are initiated at a particular frequency, e.g., one scan iteration per minute or other suitable frequency. Thus, for example, there can be a time delay between the initiation of iteration 1106a and the initiation of iteration 1106b, and so on. The time delay can correspond to the scan frequency, and can be one millisecond, 10 milliseconds, 1 second, 1 minute, or other suitable amount of time. As shown by the read operations 1102 and write operations 1104, one or more read and/or write operations can be performed by the memory sub-system between consecutive scan iterations 1106.

Each calibration scan iteration 1106 can scan one or more selected bins, e.g., by performing each calibration scan iteration 1106 for block families associated with a selected set of bins. The selected set of bins can be different for different scan iterations 1105. For example, younger bins, such as Bin1, can be scanned more frequently than older bins. Thus, as shown, Bin1 is scanned in each scan iteration 1106a-i. Bin2, which is older than Bin1, is scanned in every other scan iteration 1106b, 1106d, 1106f, 1106h. Bin3, which is older than Bin1, is scanned in every eighth scan iteration 1106i. Older bins, such as Bin4 through Bin8, are scanned less frequently, in accordance with their associated age rankings (e.g., Bin1 can be ranked first in terms of age, and Bin8 is can be ranked 8th in terms of age). As can be seen, scan iterations of Bin1 are initiated at a first frequency, while scan iterations of Bin2 are initiated at a second frequency, which is lower than the first frequency. Thus, a calibration scan process can be invoked at the first frequency, but perform a scan of one bin (e.g., Bin1) at the first frequency, and perform a scan of another bin (e.g., Bin2) at a lower second frequency by scanning Bin2 in a subset of the invocations (e.g., every other invocation, which corresponds to a second frequency that is half the first frequency). Although the frequency of scan iterations 1106 is different for each bin, the frequency of each individual bin does not vary in the example of FIG. 11A. For example, in FIG. 11A, Bin1 is scanned at a first constant frequency, and Bin2 is scanned at a second constant frequency that is half the first constant frequency.

In particular embodiments, a block family manager component 113 can adjust a calibration scan to adapt to changing characteristics of the memory sub-system. These characteristics of the memory sub-system are referred to herein as calibration demand characteristics, and can include system state characteristics, such as the power state of the memory sub-system or host, as well as characteristics of data being stored, such as workload characteristics. The calibration demand characteristics can include block family age, power state of the memory sub-system or host (e.g., active, idle, hibernating, or sleeping), workload size, program/erase cycle counts of the memory device, or read error rates. The calibration scan can be adjusted to adapt to changing calibration demand characteristics by, for example, changing the frequency of scan iterations 1106 in accordance with the calibration demand characteristics. These calibration scan adjustments can be performed in response to detecting that threshold calibration demand criteria are satisfied by the calibration demand characteristics. For example, a set of calibration demand ranges, such as ranges of read error rates, can be associated with a set of corresponding calibration scan adjustment parameters that specify how to adjust the calibration scan for each of the ranges. Alternatively, other suitable functions that map calibration demand to calibration scan adjustment parameters can be used, such as linear or quadratic functions. As such, the calibration scan can be adjusted based on the characteristics associated with the memory sub-system by modifying scan parameters such as the scan frequency or other criteria that control the initiation of calibration scans.

As an example, the calibration scan can be adjusted based on block family age by selecting a subset of the block families and scanning the subset of block families, but not other block families not in the subset. The subset of block families to be scanned can be, for example, the oldest block family in each voltage bin, as described with reference to FIGS. 12A and 12B below. The frequency of calibration scan iterations 1106 can be adjusted based on memory sub-system characteristics, as described below with reference to FIG. 12B. The block families to be prioritized in calibration scans can be determined based on read error rates associated with the block families, as described with reference to FIG. 12C below. Prioritizing block families based on read error rates can involve scanning block families associated with read error rates greater than a threshold error rate prior to scanning other block families having error rates below the threshold.

The frequency of calibration scan iterations 1106 can be adjusted based on memory sub-system characteristics such as a power state, as described below with reference to FIG. 11B. The frequency of calibration scan iterations 1106 can also be adjusted in proportion to a workload intensity, such as the number of write operations performed by the memory sub-system over a period of time, as described below with reference to FIGS. 11C and 12D, or in proportion to a number of program/erase cycles associated with a memory device, as described below with reference to FIGS. 11D and 12D.

FIG. 11B schematically illustrates an example calibration scan, performed by the memory sub-system controller, in which the scan frequency varies based on power state, in accordance with aspects of the present disclosure. In an idle state, the memory sub-system can devote a substantial amount of processing time to performing scan operations because few if any host reads or writes are expected to occur. Thus, in response to a transition from an active state 1114 to an idle state 1116, the block family manager component 113 can increase the scan frequency, as shown by scan iterations 1108. For example, in the idle state 1116, the scan frequency can be increased to a higher frequency that corresponds minimal delay (e.g., no delay, or less than a threshold amount of delay) between scan iterations 1108. As another example, in the idle state 1116, the scan frequency can be increased to a higher frequency in response to the memory sub-system or host system being in an idle power state for at least a threshold amount of time. Further, in an idle power state, the block family manager component 113 can invoke the scan process repeatedly until all bins have been calibrated, or the power state changes. As another example, the calibration scan, or an iteration of the calibration scan, can be performed in response to determining that at least one threshold criterion is satisfied. The threshold criterion can be based on a power state of the memory sub-system or host system. For example, the threshold criterion can be satisfied when the memory sub-system is in an idle power state, or when the memory sub-system transitions to an active power state from a sleep state or low power state.

In a low power state 1118 (e.g., hibernation), the block family manager component 113 can cause the memory sub-system to perform scan iterations 1110 at a lower scan frequency. For example, the memory sub-system controller can wake up (e.g., transition from low power to idle temporarily) at the lower frequency and scan a number of blocks or pages specified by a parameter. The reduced scan frequency can be based on a scan period parameter, e.g., a number of milliseconds between wake ups. The periodic wake up and scan can continue until a scan instance is complete, e.g., until all block family bin pointers in one or more block families have been calibrated. Subsequent to the low power state 1118, the memory sub-system and/or host can transition to an active state 1120 in which scan iterations can continue at the frequency used in the previous active state 1114.

As another example, a calibration scan can be performed in response to a transition of the host's power state from a sleep state to another state, such as a low power (e.g., hibernation) state, or from a sleep state or low power state to an active power state. The calibration scan can be performed on the oldest block bins to determine whether the assignment of block families to the oldest block bins are to be changed (e.g., based on data state metrics). If the assignment to the oldest block families is not to be changed, neither have the assignments of other bins to other (younger) block families. Thus, the calibration scan can stop after scanning the oldest block bins.

FIG. 11C schematically illustrates an example calibration scan, performed by the memory sub-system controller, in which the scan frequency varies based on workload, in accordance with aspects of the present disclosure. When writes are occurring frequently, a relatively large amount of new data is likely to be written, which means that new data is entering bin 1. Thus, the calibration scan should be performed at a relatively high frequency to calibrate the new data. When writes are not occurring, e.g., because the host has stopped writing data for a period of time, the existing data continues aging. As the time after the last write (e.g., program) of data increases, the data moves to older bins, and, as the time continues to increase, does not move between bins as quickly. Thus, the scan frequency can be reduced after a threshold amount of time has passed since the most recent write.

As shown in FIG. 11C, prior to a time T1, the block family manager component 113 initiates scan iterations 1126a, 1126b, and 1126c at a baseline scan frequency (e.g., one iteration per minute). At time T1, a most recent write 1124 has occurred. No subsequent writes occur until time T3, at which time a subsequent write 1128 occurs. The block family manager component 113 can decrease the scan frequency in response to detecting that no writes have been performed for at least a threshold period of time, which is shown as a threshold period without writes between times T1 and T2. At time T2, the block family manager component 113 detects that the threshold period without writes has elapsed, and changes the scan frequency to a reduced scan frequency, such as a predetermined reduced value (e.g., one iteration every three minutes), or a predetermined fraction of the baseline scan frequency (e.g., ⅓). The scan frequency can remain at the reduced value, as shown by scan iterations 1126d and 1126e, until a subsequent write 1128 is detected at time T3. In response to detecting the subsequent write 1128, the block family manager component 113 changes the scan frequency back to the baseline scan frequency, since writes are occurring more frequently and bin assignments are more likely to change.

Figure 11D:
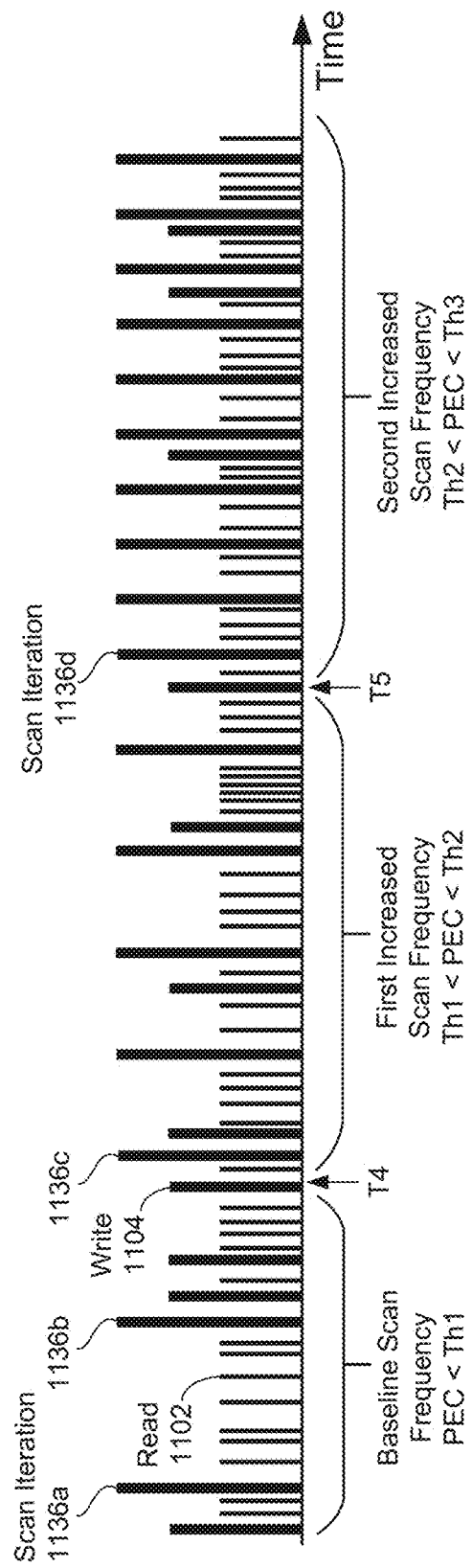
FIG. 11D schematically illustrates an example calibration scan, performed by the memory sub-system controller, in which the scan frequency varies based on program/erase count, in accordance with aspects of the present disclosure.

FIG. 11D schematically illustrates an example calibration scan, performed by the memory sub-system controller, in which the scan frequency is increased based on program/erase count, in accordance with aspects of the present disclosure. The age of a memory device can be approximated by a number of program/erase cycles (PEC) that the device has performed. When the memory device is young, e.g., less than 100 PEC, the temporal voltage shift is relatively small. As the device ages, e.g., after 100 PEC, the temporal voltage shift increases. As the device continues to age, e.g., after 1000 PEC, the temporal voltage increases still further. Thus, the scan frequency can be set to a relatively low baseline value, e.g., 1 scan iteration every 10 seconds, when the device has less than a first threshold number of PEC, such as 100 PEC. The scan frequency can be set to a first increased value, e.g., 1 scan iteration every 5 seconds, when the device has between a first threshold number Th1 of PEC (e.g., 100) and a second threshold number Th2 of PEC (e.g., 1000). The scan frequency can be set to a second increased value, e.g., 1 scan iteration every second, when the device has between the second threshold number Th2 of PEC (e.g., 1000) and a third threshold number Th3 of PEC (e.g., 10,000), and so on.

As shown in FIG. 11D, scan iterations 1136a, 1136b, and 1136c are performed at a baseline scan frequency when the PEC is less than the first threshold. At time T4, the PEC becomes greater than the first threshold. Subsequent to time T4, the block family manager component 113 detects that the PEC is between the first and second thresholds, and sets the scan frequency to the first increased value. The scan iterations between iteration 1136c and iteration 1136d occur at the first increased scan frequency. At time T5, the PEC becomes greater than the second threshold. Subsequent to time T5, the block family manager component 113 detects that the PEC is between the second and third thresholds, and sets the scan frequency to the second increased value. Scan iterations subsequent to iteration 1136d occur at the second increased scan frequency.

Figure 12A:
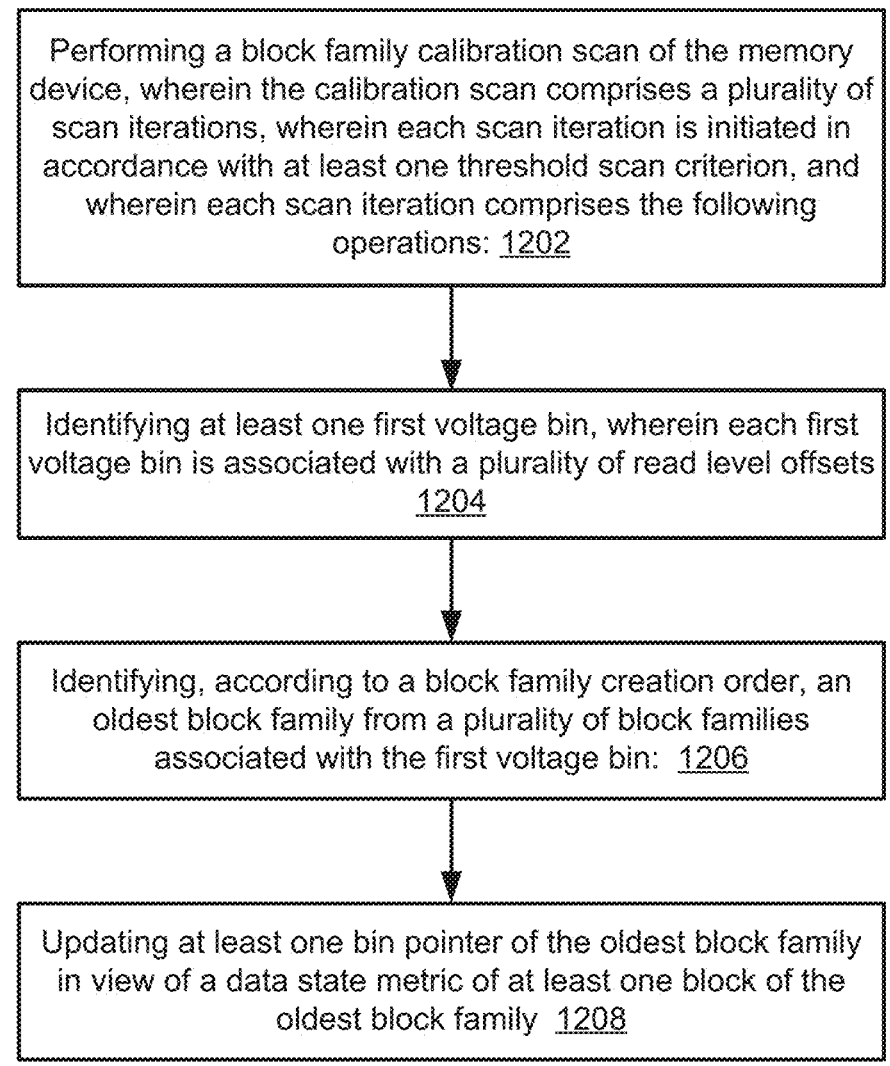
FIG. 12A is a flow diagram of an example method to perform a calibration scan in which the oldest block family within each bin is scanned, in accordance with aspects of the present disclosure.

FIG. 12A is a flow diagram of an example method 1200 to perform a calibration scan in which the oldest block family within each bin is scanned, in accordance with aspects of the present disclosure. The calibration scan can be adjusted to prioritize blocks that are likely to become mis-calibrated in the near future. Block families can be prioritized based on their age by selecting a subset of the block families that are older than other block families, and scanning the subset of block families, but not other block families. The subset of block families to be scanned can be, for example, the oldest block family in each voltage bin, or the oldest N block families in each voltage bin, where N is a threshold number of oldest block families.

The method 1200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1200 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1202, the processing device performs a block family calibration scan of the memory device, wherein the calibration scan comprises a plurality of scan iterations. Each scan iteration is initiated in accordance with at least one threshold scan criterion, and wherein each scan iteration comprises the following operations. At operation 1204, the processing device identifies at least one first voltage bin, wherein each first voltage bin is associated with a plurality of read level offsets. At operation 1206, the processing device identifies, according to a block family creation order, an oldest block family from a plurality of block families associated with the first voltage bin. As shown in FIG. 7, an oldest block family associated with a bin can be identified by searching the block family metadata table 720 for the lowest block family number associated with the bin. As described above with respect to FIG. 7, in the example block family metadata table 720, bin 0 is associated with block families 60-64, bin 1 is associated with block family 59, bin 6 is associated with block family 5, and bin 7 is associated with block families 0-4. In the block family metadata table 720, the oldest block family associated with bin 0 is block family 60, since the block family number (60) is the lowest of the block family numbers associated with bin 0. Similarly, the oldest block family associated with bin 1 is block family 59, the oldest block family associated with bin 6 is block family 5, and the oldest block family associated with bin 7 is block family 0.

At operation 1208, the processing device performs a block family calibration by updating at least one bin pointer of the oldest block family in view of a data state metric of at least one block of the oldest block family.

Figure 12B:
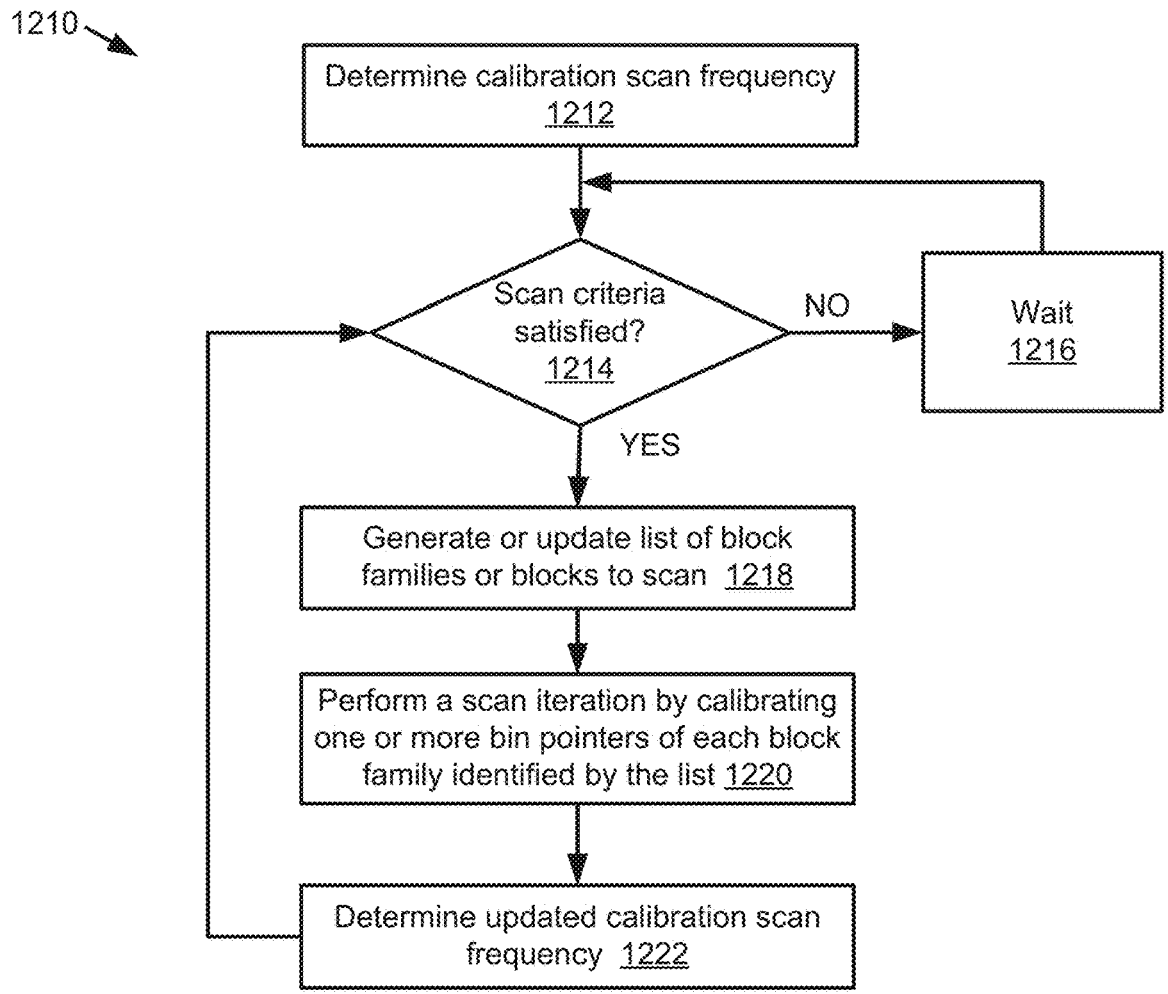
FIG. 12B is a flow diagram of an example method to perform a calibration scan in which the block family prioritization and calibration scan frequency can vary based on characteristics associated with the memory sub-system, in accordance with aspects of the present disclosure.

FIG. 12B is a flow diagram of an example method 1210 to perform a calibration scan in which the block family prioritization and calibration scan frequency can vary based on characteristics associated with the memory sub-system, in accordance with aspects of the present disclosure. The method 1210 can prioritize selected block families and adjust the calibration scan frequency.

The method 1210 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1210 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1212, the processing device determines a calibration scan frequency. At operation 1214, the processing device evaluates one or more scan criteria, and determines whether the scan criteria are satisfied. The scan criteria can be, for example, that the current system time has exceeded the time at which the next scan iteration is to be performed according to the current scan frequency. Other scan criteria are possible. For example, the scan criteria can be that the power state of the memory sub-system and/or the host has transitioned. The transition can be to an idle state, for example, in which case the scan frequency can be increased, as described above. The transition can be to a low power (e.g., hibernate) state as another example, in which case the scan frequency can be decreased and a wake up can be scheduled to occur to perform the next scan iteration at a time based on the decreased scan frequency.

At operation 1216, if the scan criteria are not satisfied, the processing device waits, e.g., for a period of time, or until a condition is detected, such as a change in a condition that affects the scan criteria (e.g., a host read or write operation). After waiting, the processing device performs operation 1214 again to determine whether the scan criteria are satisfied.

If operation 1214 determines that the scan criteria are satisfied, then at operation 1218, the processing device generates or updates a list of block families or blocks to scan. The block families to scan can be, e.g., the oldest block families in each bin. The blocks can be individual blocks, in which case the blocks can be mapped to their associated block families. The list can be generated by the method of FIG. 12C. At operation 1220, the processing device performs a scan iteration by calibrating one or more bin pointers of each block family identified by the list. If the list contains a block, the block family associated with the block can be calibrated. To calibrate a block family, the processing device can update one or more bin pointers of the block family in view of a data state metric determined by a measurement of at least one of the block family's blocks (e.g., measurement of a memory cell that stores a portion of the block). At operation 1222, the processing device determines an updated calibration scan frequency. The updated calibration scan frequency can be determined by the method of FIG. 12D. Operation 1222 causes the processing device to invoke operation 1214 to prepare to perform another scan iteration. The next scan iteration can use the list of families or blocks generated at operation 1218 and the updated calibration scan frequency determined at operation 1222.

Figure 12C:
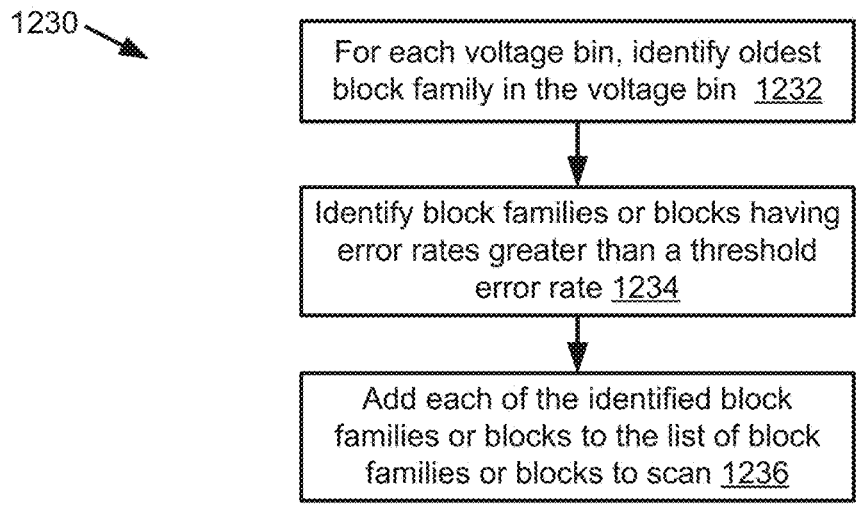
FIG. 12C is a flow diagram of an example method to determine block family prioritization based on characteristics associated with the memory sub-system, in accordance with aspects of the present disclosure.

FIG. 12C is a flow diagram of an example method 1230 to determine block family prioritization based on characteristics associated with the memory sub-system, in accordance with aspects of the present disclosure. The block families to be prioritized in calibration scans can be determined based on read error rates associated with the block families, for example. Prioritizing block families based on read error rates can cause the block family manager component 113 to scan block families associated with read error rates greater than a threshold error rate prior to scanning other block families having error rates below the threshold. Alternatively, a priority can be associated with each block family based on a function of the block family's error rate, and the block families can be scanned in order according to their priorities.

The method 1230 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1230 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1232, the processing device, identifies the oldest block family in the voltage bin, e.g., as described above with respect to FIG. 12A. At operation 1234, the processing device identifies one or more block families or blocks having error rates greater than a threshold error rate. The error rates can be read error rates, which the processing device can determine as a ratio of the number of reads that have caused an error handler to be executed to a total number of reads performed by the memory sub-system. Alternatively or additionally, the error rates can be raw bit error rates (RBER), which can be determined based on information collected when data is read from a block family (or block). The information can include mean, median, maximum, and minimum number of bits in error per block family (or block). If the read error rate associate with a block family or block is greater than a read error rate threshold, or the raw bit error rate is greater than a raw bit error rate threshold, then the associated block family (or block) can be prioritized for recalibration, e.g., by adding the associated block family (or block) to the list. At operation 1236, the processing device adds each of the identified block families or blocks to the list of block families or blocks to scan.

Figure 12D:
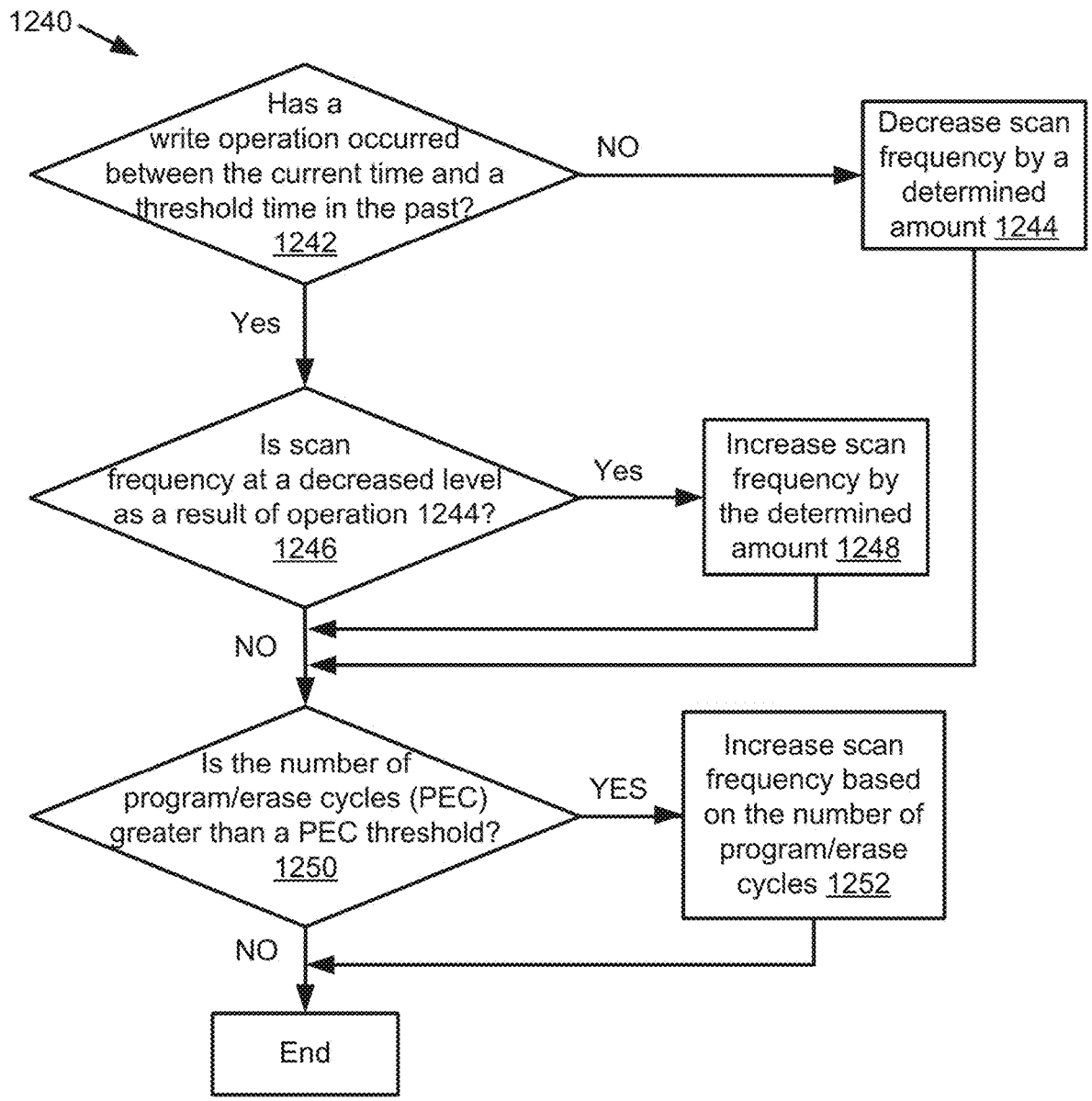
FIG. 12D is a flow diagram of an example method to determine calibration scan frequency based on characteristics associated with the memory sub-system, in accordance with aspects of the present disclosure.

FIG. 12D is a flow diagram of an example method 1240 to determine calibration scan frequency based on characteristics associated with the memory sub-system, in accordance with aspects of the present disclosure. The frequency of calibration scan iterations 1106 can be adjusted in proportion to a workload intensity, such as the number of write operations performed by the memory sub-system over a period of time, or in proportion to a number of program/erase cycles associated with a memory device.

The method 1240 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1240 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1242, the processing device determines whether a write operation has occurred between the current (system) time and a threshold time in the past. If so, then the processing device performs operation 1246. If a write operation has not occurred between the current time and the threshold time in the past, then at operation 1244, the processing device decreases the scan frequency by a determined amount, e.g., as described above with respect to FIG. 11C. Operation 1244 then causes the processing device to perform operation 1250.

At operation 1246, the processing device determines whether the scan frequency is at a decreased level as a result of a previous execution of operation 1244. If so, at operation 1248, the processing device increases the scan frequency by the determined amount. Alternatively, the processing device can set the scan frequency to a baseline frequency if operation 1244 reduced the scan frequency from the baseline frequency. If the scan frequency is not at a decreased level as a result of operation 1244, then the processing device performs operation 1250. At operation 1250, the processing device determines whether the number of program/erase cycles (PEC) associated with the memory sub-system is greater than a PEC threshold. If so, at operation 1252, the processing device increases the calibration scan frequency based on the number of program/erase cycles. If the number of program/erase cycles (PEC) associated with the memory sub-system is not greater than a PEC threshold, then the calibration scan frequency is not changed.

Figure 13:
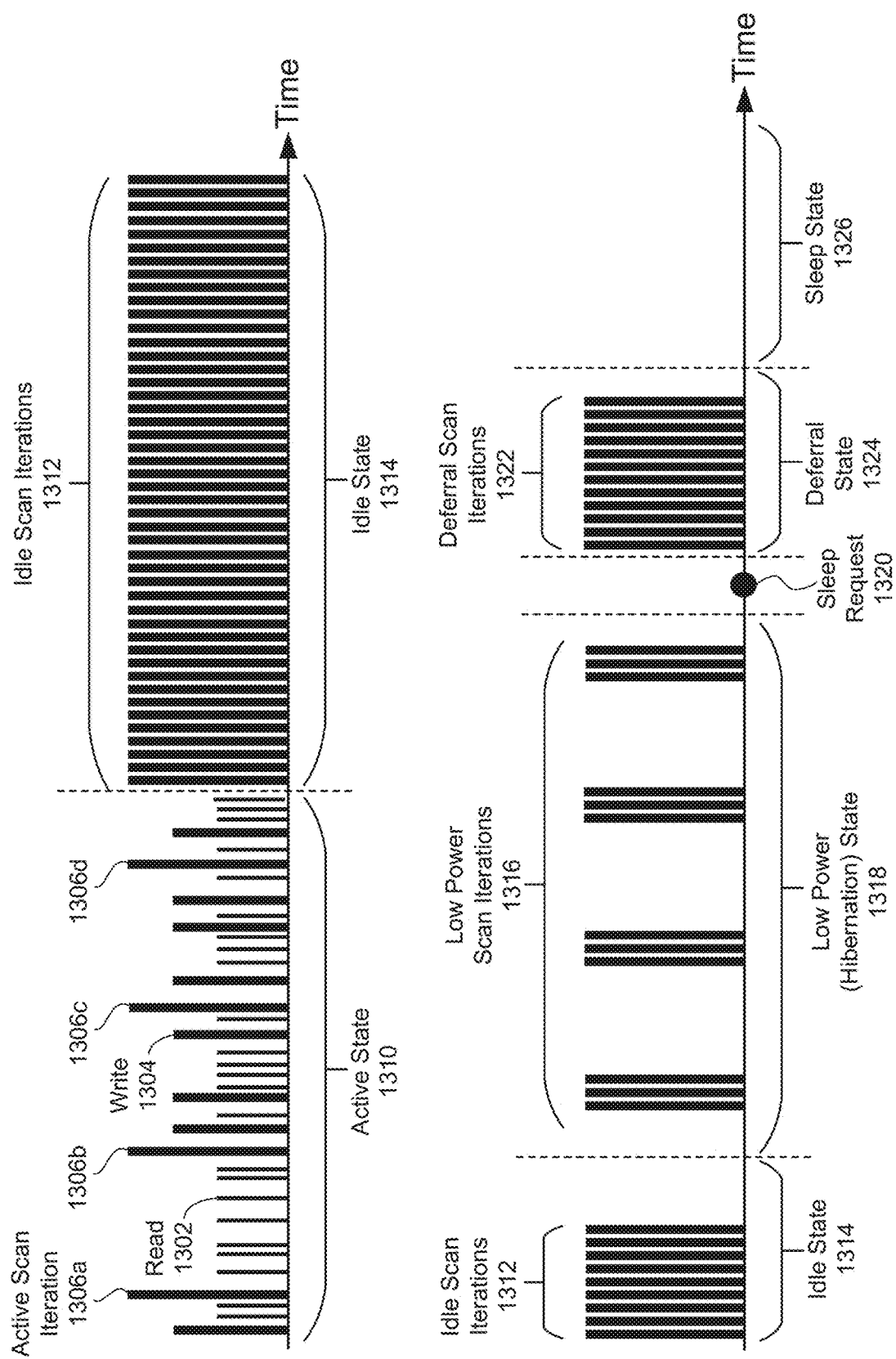
FIG. 13 schematically illustrates calibration scans, performed by the memory sub-system controller, in which the scan frequency varies based on power state, in accordance with aspects of the present disclosure.

FIG. 13 schematically illustrates calibration scans, performed by the memory sub-system controller, in which the scan frequency varies based on power state, in accordance with aspects of the present disclosure. Each calibration scan is illustrated as a sequence of operations that occur over time. Each operation is shown as vertical line, and time increases as shown by the arrow pointing to the right. FIG. 13 shows operations that occur during an active state 1310, an idle state 1314, a low power (hibernation) state 1318, a deferral state 1324 that occurs as a result of a sleep request 1320, and a sleep state 1326 that also occurs as a result of the sleep request 1320 and is subsequent to the deferral state 1324. The active state 1310 is similar to the active state described above with respect to FIG. 11A. The active state 1310 corresponds to a time period in which a memory sub-system (or host system) is in an active (e.g., awake) power state. The times at which particular example operations are initiated are represented by read operations 1302 (each shown as one of the shorted vertical lines), write operations 1304 (each shown as one of the medium-length vertical lines), and scan iterations 1306 (each shown as one of the tallest vertical lines). "Calibration scan iteration" herein can refer to an execution of a calibration process that calibrates at least a portion of the block families in the memory sub-system. The calibration process can be executed repeatedly at different times (e.g., periodically, or in response to particular criteria being satisfied). Adjusting the calibration scan frequency can include performing calibration scan iterations in response to certain criteria, such as a power state transition to an idle state from a hibernating state. A calibration scan iteration can be initiated in response to the memory sub-system transitioning to a higher power state from a lower power state, such to an active state from a low-power state, such as a sleep or hibernate state.

Each read operation 1302 or each write operation 1304 can be performed by the memory sub-system in response to a respective read or write request from the host. A calibration scan iteration can be execution of a calibration process that can be executed repeatedly at different times (e.g., periodically, or in response to particular criteria being satisfied). Further details of the active state, the read operation 1302, write operation 1304, and calibration scan iterations 1306 are provided above with respect to FIG. 11A.

The power state of the system can correspond to a level of activity occurring in the system, and to an amount of power that can be consumed by the system. The power state of the system at a particular time can be one of a set of supported states, such as active, idle, low power (hibernate), or deep sleep. The power state can transition between the supported states in response to particular conditions being detected by the system, such as passage of a threshold amount of time without receiving input form a user, battery charge falling below a threshold level, receiving user input requesting a power state change, and so on. In the active state, the system (e.g., the memory sub-system and/or the host system) is awake and in a full running state in which the memory sub-system accepts host commands and performs read or write operations requested by the host. When the system is in the active power state, calibration scans can be performed at particular "baseline" frequency, which can change over time. Calibration scans can also be performed in the active power state at other times, such as in response to detecting a high read error rate. For example, the baseline frequency can be used to determine when to initiate calibration scan iterations for bin 1, as described above. The frequencies of the other bins can be based on the frequency of bin 1 (e.g., logarithmically decreasing with bin age), so the frequency of each bin, though different from other bins, can remain constant during times in which the system is in the active power state. The baseline frequency can also change over time, e.g., in response to changes in workload intensity or the number of program/erase cycles. The baseline scan frequency can be, for example, the time between scans of two page lines, or other suitable duration of time.

In the example of FIG. 13, the memory sub-system enters (e.g., transitions to) an idle state 1314 subsequent to the active state 1310. The transition to the idle state 1314 can occur in response to criteria such as user input, absence of application activity or user input, and so on. The idle state 1314, for example, can be a state in which host commands are not being received, though the system is still awake (e.g., devices are still powered on). The idle state 1314 can correspond to the idle state of a mobile device, or the PS0 state of an NVMe/PCIe device. Since the host is not requesting operations in the idle state, the memory sub-system can perform idle scan operations 1312 at a high frequency, e.g., as high of a frequency as possible, by using as much of its processing resources as possible to perform and complete a calibration scan instance (e.g., a scan of all bins or of all block families). There is little if any delay between initiation of consecutive scan iterations 1312. For example, the memory sub-system can perform each subsequent idle scan iteration 1312 immediately after completion of the prior scan iteration 1312, without initiating other operations between subsequent idle scan iterations 1312. A calibration scan instance can be completed by, for example, performing the scan for each block family of each voltage bin. For example, the memory sub-system can perform the calibration scan until the calibration is complete (e.g., one calibration instance is complete) or until the power state changes to a state other than idle. As can be seen by the absence of operations near the end of the idle state 1314 in FIG. 13, an example calibration scan instance has been completed prior to the end of the idle state 1314. During the idle state 1314 or in a subsequent idle state (not shown), the memory sub-system can begin another calibration scan instance after completion of a calibration scan instance, or after a period of time has elapsed since completion of the previous calibration scan instance.

Subsequent to the idle state 1314, the memory sub-system enters a low-power (hibernation) state 1318. The low power (hibernate) state can be a state in which power consumption is reduced to a low level and processing is stopped for periods of time. System clocks can be slowed down to reduce power consumption by the memory sub-system. Certain components, such as the memory cells, can remain powered on. The low power (hibernate) state 1318 can have a self-awake feature in which the memory sub-system controller can request that operations be performed, e.g., at a specified frequency. In the low power (hibernate) state 1318, the memory sub-system can cause iterations of the calibration scan to be performed at the specified frequency, and each iteration can scan a specified number of pages. In the low power state 1318, the memory sub-system performs low power scan iterations 1316 in bursts that are initiated at the specified frequency. Each burst can include one or more of the scan iterations 1316. In the illustrated example, three iterations are shown in each burst. The scanning can continue at the specified frequency in the low power (hibernate) state until, for example, a scan instance (e.g., a scan of all bins or of all block families) has been completed, or the system power state transitions to a different state. The low power (hibernate) state can correspond to the hibernate state of a mobile device, or the PS1-PS3 state of an NVMe/PCIe device.

Subsequent to the idle state 1314, the memory sub-system begins a transition to a sleep state 1326. The sleep state can be a state in which the system is shut down, e.g., not performing operations. Calibrations scans are not ordinarily performed when the system is in the sleep state, but can be performed for a short period of time (shown as a deferral state 1324), prior to entering the sleep state, using a sleep deferment feature. The memory sub-system can receive a sleep request 1320 or other notification that the power state is to transition to the sleep state 1326. The memory sub-system controller can then request a deferral of the sleep state to perform calibration scan operations in a deferral time period prior to entering the sleep state 1326. The system enters the sleep state 1326 in response to expiration of the deferral time period. The deferral time period can be, for example, 1 millisecond, or other suitable time. The deferral time period is shown as the deferral state 1324. During the deferral time period, the memory sub-system can perform one or more deferral scan iterations 1322. The deferral scan iterations can be performed on high-priority bins or block families, e.g., the oldest bins, or block families that have been identified as having high error rates. As shown in FIG. 13, the deferral scan iterations 1322 are complete prior to the end of the deferral time period that corresponds to the deferral state 1324. Upon expiration of the deferral time period, the system enters the sleep state 1326. The sleep state can correspond to the deep sleep state of a mobile device, or the PS4 state of an NVMe/PCIe device, for example.

Figure 14A:
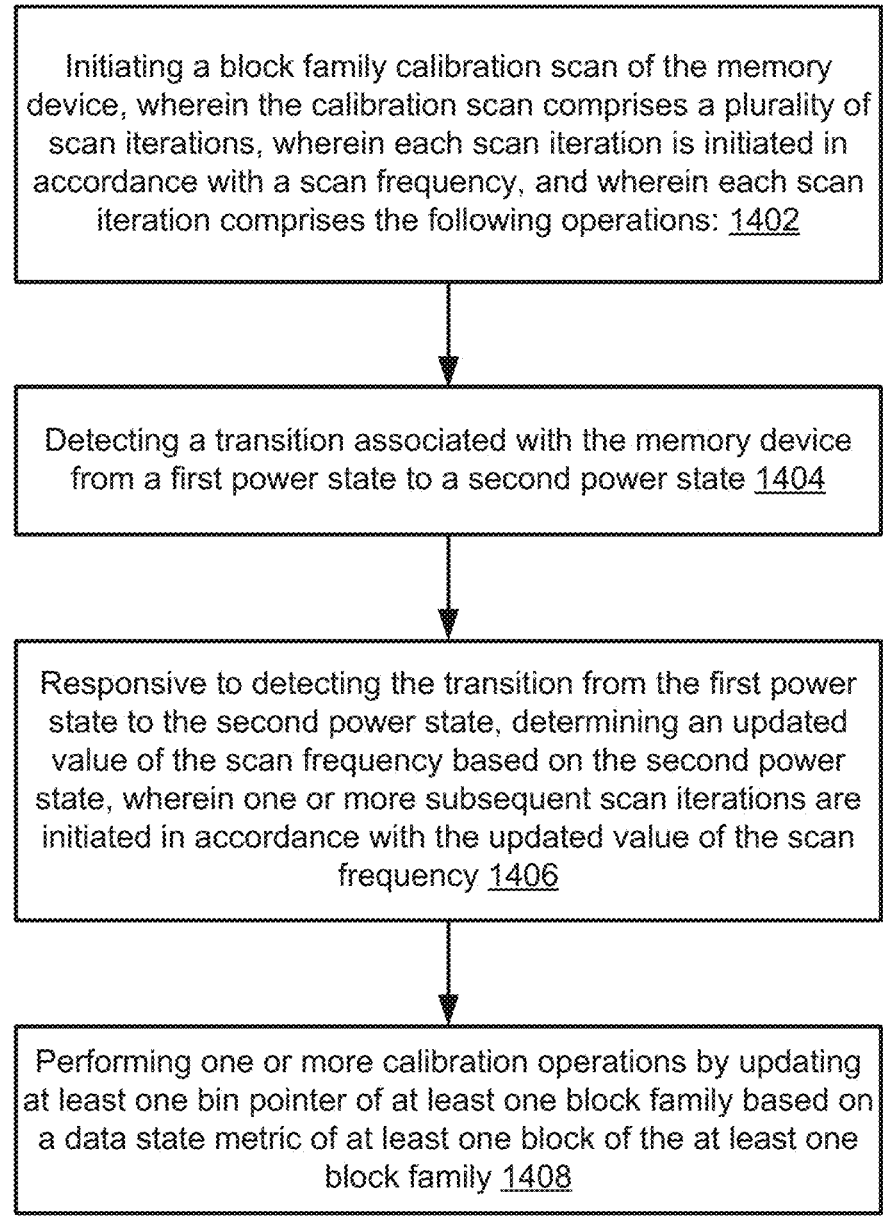
FIGS. 14A and 14B are flow diagrams of example methods to perform calibration scans in which the scan frequency varies based on power state, in accordance with aspects of the present disclosure.

FIG. 14A is a flow diagram of an example method 1400 to perform calibration scans in which the scan frequency varies based on power state, in accordance with aspects of the present disclosure. The method 1400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1400 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 14B:
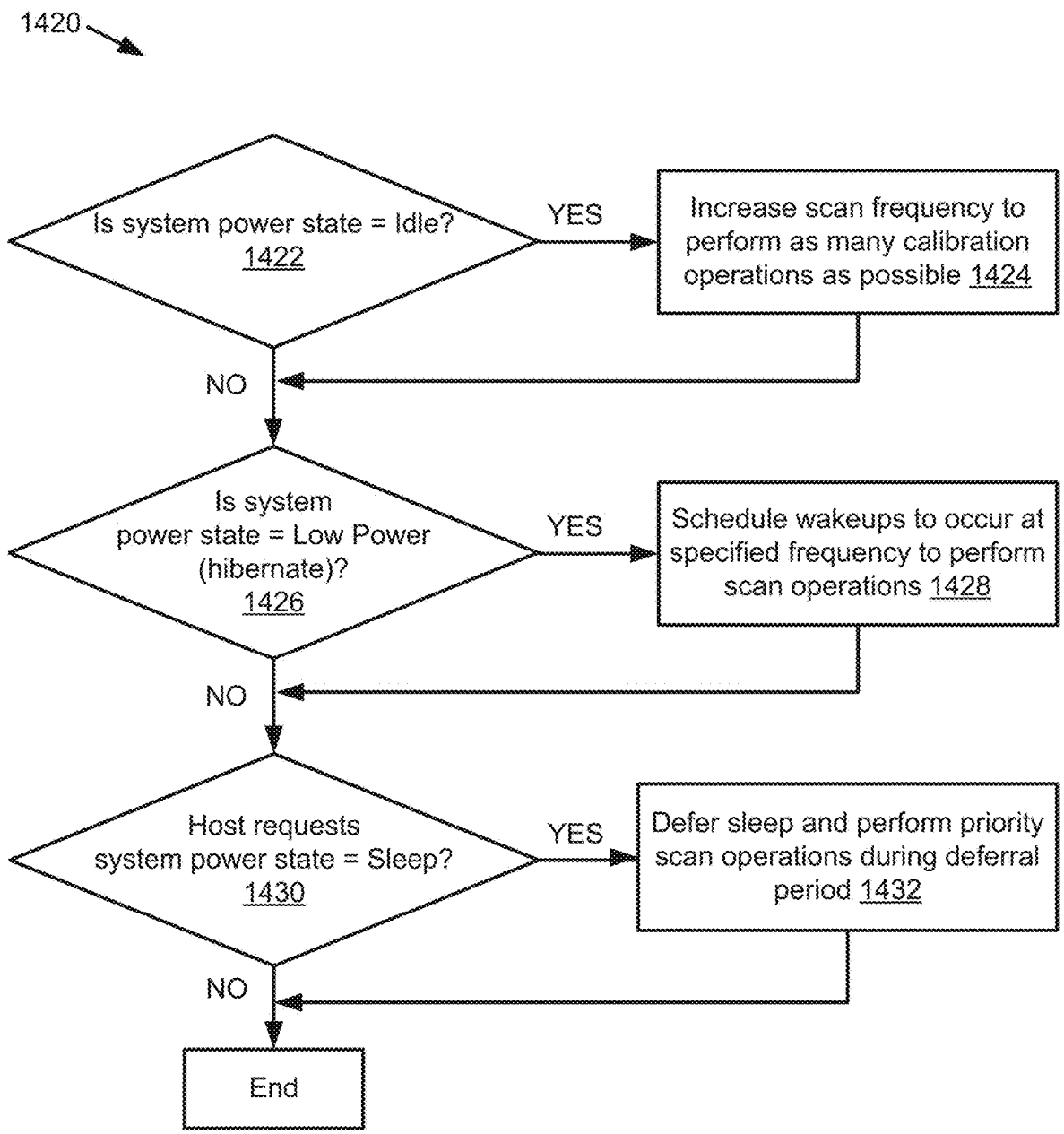

At operation 1402, the processing device initiates a block family calibration scan of the memory device. The calibration scan comprises a plurality of scan iterations, each of which is initiated in accordance with a scan frequency. Each scan iteration comprises the operations 1404-1408. At operation 1404, the processing device detects a transition associated with the memory device from a first power state to a second power state. At operation 1406, the processing device, responsive to detecting the transition from the first power state to the second power state, determines an updated value of the scan frequency based on the second power state. One or more subsequent scan iterations are initiated (e.g., by one or more subsequent executions of operation 1402) in accordance with the updated value of the scan frequency. At operation 1408, the processing device performs one or more calibration operations by updating at least one bin pointer of at least one block family based on a data state metric of at least one block of the at least one block family, FIG. 14B is a flow diagram of an example method 1420 to perform calibration scans in which the scan frequency varies based on power state, in accordance with aspects of the present disclosure. The method 1420 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1420 is performed by the block family manager component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1422, the processing device determines whether the system power state is an idle state. If so, at operation 1424, the processing device increases the calibration scan frequency to perform as many calibration operations as possible, and execution subsequently continues at operation 1426. If operation 1422 determines that the power state is not idle, then execution continues at operation 1426.

At operation 1426, the processing device determines whether the system power state is a low power (e.g., hibernate) state. If so, at operation 1428, the processing device schedules one or more wakeups to occur at a specified frequency to perform calibration scan operations, and execution subsequently continues at operation 1430. If operation 1426 determines that the power state is not idle, then execution continues at operation 1430.

At operation 1430, the processing device determines whether the host has requested that the system enter a sleep power state. For example, the processing device can receive a notification from the host indicating that the host is requesting a sleep power state. If the host has requested that the system enter the sleep power state, the processing device defers the entry into the sleep state and performs priority scan operations during deferral period. Upon expiration of the deferral period, the host enters the sleep power state.

Although particular power states and corresponding actions related to performing calibration scans are described herein, other power states are contemplated, and any suitable actions related to performing calibration scans can be performed by the memory sub-system.

Figure 15:
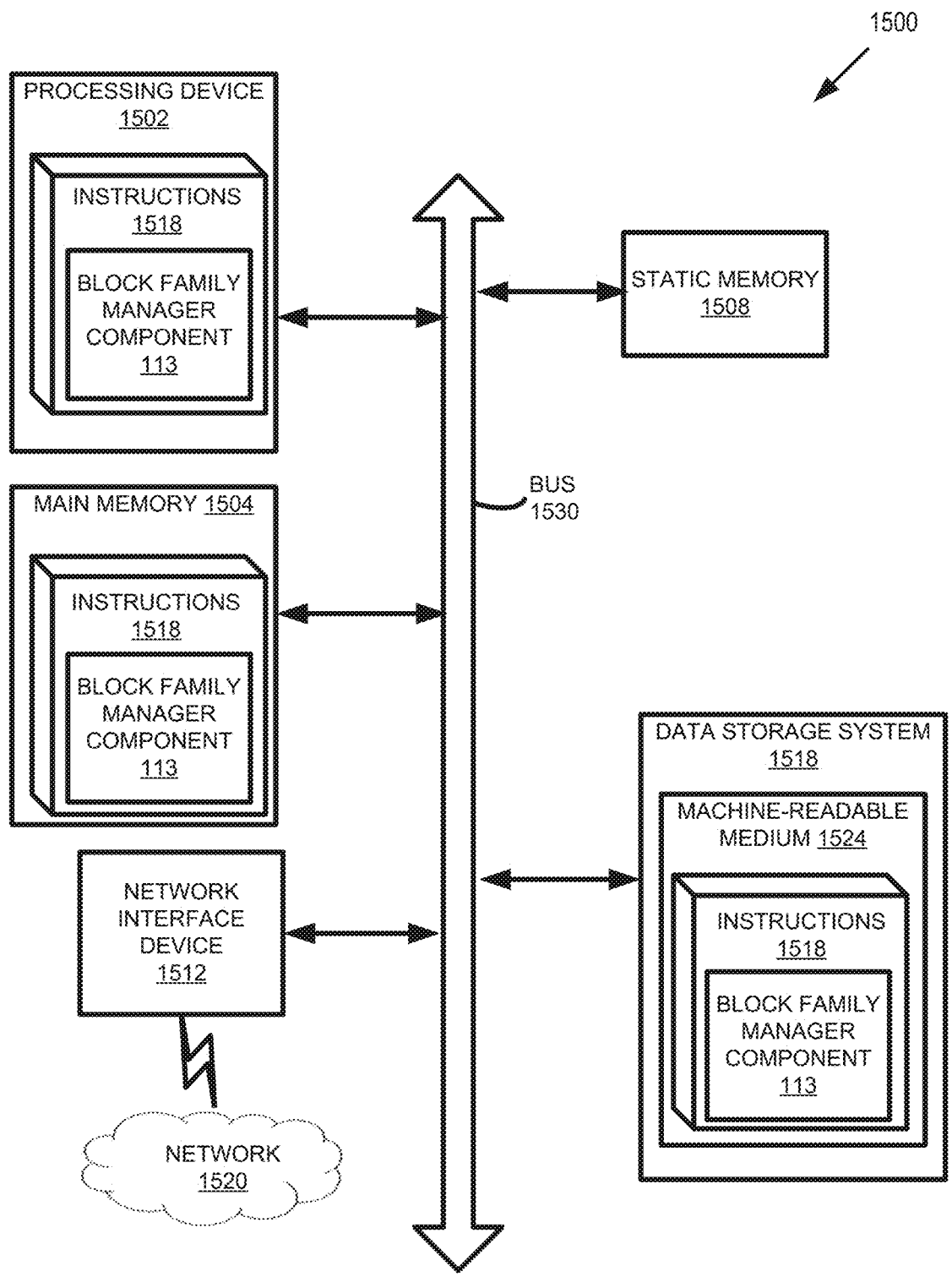
FIG. 15 is a block diagram of an example computer system in which embodiments of the present disclosure can operate.

FIG. 15 illustrates an example machine of a computer system 1500 within which a set of instructions, for causing the machine to perform any one or more of the methodologies discussed herein, can be executed. In some embodiments, the computer system 1500 can correspond to a host system (e.g., the host system 120 of FIG. 1) that includes, is coupled to, or utilizes a memory sub-system (e.g., the memory sub-system 150 of FIG. 1) or can be used to perform the operations of a controller (e.g., to execute an operating system to perform operations corresponding to the block family manager component 153 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1500 includes a processing device 1502, a main memory 1504 (e.g., read-only memory (ROM), flash memory, dynamic random access memory (DRAM) such as synchronous DRAM (SDRAM) or RDRAM, etc.), a static memory 1506 (e.g., flash memory, static random access memory (SRAM), etc.), and a data storage system 1518, which communicate with each other via a bus 1530.

Processing device 1502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1502 can also be one or more special-purpose processing devices such as an application specific integrated circuit (ASIC), a field programmable gate array (FPGA), a digital signal processor (DSP), network processor, or the like. The processing device 1502 is configured to execute instructions 1526 for performing the operations and steps discussed herein. The computer system 1500 can further include a network interface device 1508 to communicate over the network 1520.

The data storage system 1518 can include a machine-readable storage medium 1524 (also known as a computer-readable medium) on which is stored one or more sets of instructions 1526 or software embodying any one or more of the methodologies or functions described herein. The instructions 1526 can also reside, completely or at least partially, within the main memory 1504 and/or within the processing device 1502 during execution thereof by the computer system 1500, the main memory 1504 and the processing device 1502 also constituting machine-readable storage media. The machine-readable storage medium 1524, data storage system 1518, and/or main memory 1504 can correspond to the memory sub-system 150 of FIG. 1.

In one embodiment, the instructions 1526 include instructions to implement functionality corresponding to a block family manager component (e.g., the block family manager component 153 of FIG. 1). While the machine-readable storage medium 1524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
performing a block family calibration scan of the memory device, wherein the calibration scan comprises a plurality of scan iterations, wherein each scan iteration is initiated in accordance with at least one threshold scan criterion, and wherein each scan iteration comprises:
identifying at least one first voltage bin, wherein each first voltage bin is associated with a plurality of read level offsets;
identifying, according to a block family creation order, an oldest block family from a plurality of block families associated with the first voltage bin; and
updating at least one bin pointer of the oldest block family based on a data state metric of at least one block of the oldest block family.

2. The system of claim 1, wherein the threshold scan criterion is based on a power state associated with the memory device, and wherein the threshold scan criterion is further based on a determination that the memory device is in an idle power state.

3. The system of claim 1, wherein the threshold scan criterion is satisfied in response to a host system associated with the memory device transitioning to an active power state from at least one of a sleep state or low power state.

4. The system of claim 1, wherein the threshold scan criterion comprises a scan frequency, and wherein the scan frequency is determined based on a write workload characterized by a number of write requests received form a host system associated with the memory device.

5. The system of claim 4, wherein the write workload comprises one or more of: a rate at which the write requests are received from the host system or an amount of data written by the write requests received from the host system.

6. The system of claim 1, wherein the threshold scan criterion comprises a scan frequency based on a number of program/erase cycles associated with the memory device.

7. The system of claim 1, wherein the threshold scan criterion comprises a scan frequency based on one or more of a read error rate of the memory device or a raw bit error rate (RBER) of the memory device.

8. The system of claim 7, wherein the operations further comprise:
in response to an increase of at least a threshold amount in the read error rate of the memory device, prioritizing, in the calibration scan, block families associated with a block being currently scanned.

9. The system of claim 8, wherein prioritizing comprises scanning the block families associated with the block family currently being scanned prior to scanning other block families.

10. The system of claim 1, wherein each block family comprises a plurality of blocks of the memory device that have been programmed within a corresponding time window.

11. The system of claim 1, wherein updating at least one bin pointer of the oldest block family comprises:
determining one or more values of the data state metric based on at least one block of the oldest block family;
identifying a second voltage bin based on the values of the data state metric; and
associating the oldest block family with the second voltage bin.

12. A method comprising:
performing, by a computing device, a block family calibration scan of a memory device, wherein the calibration scan comprises a plurality of scan iterations, wherein each scan iteration is initiated in accordance with at least one threshold scan criterion, and wherein each scan iteration comprises:
identifying at least one first voltage bin, wherein each first voltage bin is associated with a plurality of read level offsets;
identifying, according to a block family creation order, an oldest block family from a plurality of block families associated with the first voltage bin; and
updating at least one bin pointer of the oldest block family based on a data state metric of at least one block of the oldest block family.

13. The method of claim 12, wherein the threshold scan criterion is based on a power state associated with the memory device, and wherein the threshold scan criterion is further based on a determination that the memory device is in an idle power state.

14. The method of claim 12, wherein the threshold scan criterion comprises a scan frequency based on one or more of:
a number of program/erase cycles associated with the memory device,
a read error rate of the memory device or,
a raw bit error rate (RBER) of the memory device.

15. The method of claim 12, wherein each block family comprises a plurality of blocks of the memory device that have been programmed within a corresponding time window.

16. The method of claim 12, wherein updating at least one bin pointer of the oldest block family comprises:
determining one or more values of the data state metric based on at least one block of the oldest block family;
identifying a second voltage bin based on the values of the data state metric; and
associating the oldest block family with the second voltage bin.

17. A non-transitory machine-readable storage medium storing instructions that cause a processing device to perform operations comprising:
performing a block family calibration scan of a memory device, wherein the calibration scan comprises a plurality of scan iterations, wherein each scan iteration is initiated in accordance with at least one threshold scan criterion, and wherein each scan iteration comprises:
identifying at least one first voltage bin, wherein each first voltage bin is associated with a plurality of read level offsets;
identifying, according to a block family creation order, an oldest block family from a plurality of block families associated with the first voltage bin; and
updating at least one bin pointer of the oldest block family based on a data state metric of at least one block of the oldest block family.

18. The non-transitory machine-readable storage medium of claim 17, wherein the threshold scan criterion is based on a power state associated with the memory device, and wherein the threshold scan criterion is further based on a determination that the memory device is in an idle power state.

19. The non-transitory machine-readable storage medium of claim 17, wherein the threshold scan criterion is satisfied in response to a host system associated with the memory device transitioning to an active power state from at least one of a sleep state or low power state.

20. The non-transitory machine-readable storage medium of claim 17, wherein the threshold scan criterion comprises a scan frequency, and wherein the scan frequency is determined based on a write workload characterized by a number of write requests received form a host system associated with the memory device.

* * * * *